United States Patent
Graf et al.

(10) Patent No.: US 8,338,806 B2
(45) Date of Patent: Dec. 25, 2012

(54) GAS CLUSTER ION BEAM SYSTEM WITH RAPID GAS SWITCHING APPARATUS

(75) Inventors: Michael Graf, Belmont, MA (US);
Robert K. Becker, Danvers, MA (US);
Christopher T. Reddy, Groveland, MA (US); Noel Russell, Waterford, NY (US)

(73) Assignee: TEL Epion Inc., Billerica, MA (US)

( * ) Notice: Subject to any disclaimer, the term of this patent is extended or adjusted under 35 U.S.C. 154(b) by 260 days.

(21) Appl. No.: 12/774,051

(22) Filed: May 5, 2010

(65) Prior Publication Data

US 2011/0272594 A1 Nov. 10, 2011

(51) Int. Cl.
*A61N 5/00* (2006.01)

(52) U.S. Cl. ................ 250/492.3; 250/423 R; 250/427

(58) Field of Classification Search ............... 250/492.3
See application file for complete search history.

(56) References Cited

U.S. PATENT DOCUMENTS

| | | | |
|---|---|---|---|
| 4,152,478 A | 5/1979 | Takagi | |
| 4,361,762 A | 11/1982 | Douglas | |
| 4,740,267 A | 4/1988 | Knauer et al. | |
| 4,886,971 A | 12/1989 | Matsumura et al. | |
| 4,916,311 A | 4/1990 | Fuzishita et al. | |
| 5,280,983 A * | 1/1994 | Maydan et al. | 294/119.1 |
| 5,669,556 A * | 9/1997 | Yoshida | 239/83 |
| 5,907,780 A | 5/1999 | Gilmer et al. | |
| 6,218,207 B1 | 4/2001 | Itoh et al. | |
| 6,486,478 B1 | 11/2002 | Libby et al. | |
| 6,797,334 B2 | 9/2004 | Akizuki et al. | |
| 6,797,339 B2 | 9/2004 | Akizuki et al. | |
| 6,857,447 B2 * | 2/2005 | Olander et al. | 137/240 |
| 7,060,988 B2 * | 6/2006 | Mack et al. | 250/423 R |
| 7,060,989 B2 | 6/2006 | Swenson et al. | |
| 7,173,252 B2 | 2/2007 | Mack | |
| 7,259,036 B2 | 8/2007 | Borland et al. | |
| 7,670,964 B2 * | 3/2010 | Lane | 438/788 |

(Continued)

FOREIGN PATENT DOCUMENTS

EP 2088613 A1 8/2009

(Continued)

OTHER PUBLICATIONS

European Patent Office, International Search Report and Written Opinion issued in corresponding International Application No. PCT/US2011/035158 dated Jul. 27, 2011, 11 pp.

(Continued)

*Primary Examiner* — Phillip A Johnston
(74) *Attorney, Agent, or Firm* — Wood, Herron & Evans, LLP

(57) ABSTRACT

A processing system is provided for irradiating a substrate with a gas cluster ion beam (GCIB). The system includes a nozzle for forming and emitting gas cluster beams through a nozzle outlet, and a stagnation chamber that is located upstream of and adjacent the nozzle. The stagnation chamber has an inlet, and the nozzle is configured to direct a single gas cluster beam toward the substrate. An ionizer is positioned downstream of the outlet and is configured to ionize the gas cluster beam to form the GCIB. The system also includes a gas supply that is in fluid communication with the inlet of the stagnation chamber, and which includes a gas source and a valve located between the gas source and the nozzle for controlling flow of a gas between the gas source and the nozzle.

29 Claims, 11 Drawing Sheets

U.S. PATENT DOCUMENTS

| | | | |
|---|---|---|---|
| 7,855,123 | B2 * | 12/2010 | Lee et al. ............... 438/422 |
| 8,097,860 | B2 * | 1/2012 | Tabat et al. ............. 250/424 |
| 2002/0005676 | A1 | 1/2002 | Greer |
| 2002/0068128 | A1 | 6/2002 | Akizuki et al. |
| 2002/0130275 | A1 | 9/2002 | Mack et al. |
| 2005/0155951 | A1 | 7/2005 | Suzuki et al. |
| 2005/0181621 | A1 | 8/2005 | Borland et al. |
| 2006/0105570 | A1 | 5/2006 | Hautala et al. |
| 2006/0124934 | A1 | 6/2006 | Fukumiya et al. |
| 2007/0210366 | A1 | 9/2007 | Sandhu et al. |
| 2007/0224824 | A1 | 9/2007 | Chen et al. |
| 2008/0149826 | A1 | 6/2008 | Renau et al. |
| 2009/0152629 | A1 | 6/2009 | Hu et al. |
| 2010/0193472 | A1 | 8/2010 | Tabat et al. |
| 2011/0272594 | A1 | 11/2011 | Graf et al. |

FOREIGN PATENT DOCUMENTS

| | | |
|---|---|---|
| JP | 62296357 A | 12/1987 |
| JP | 06275545 | 9/1994 |
| WO | 0170378 A1 | 9/2001 |

OTHER PUBLICATIONS

Park et al., Evolution of Residual Stress in Plasma-enhanced Chemical-Vapor-Deposited Silicon Dioxide Film Exposed to Room Air, Applied Physics Letters, Dec. 13, 1999, pp. 3811-3813, vol. 75, No. 24.

Nguyen, S. V., High-density Plasma Chemical Vapor Deposition of Silicon-based Dielectric Films for Integrated Circuits, J. Res. Develop., Jan./Mar. 1999, pp. 109-126, vol. 43, No. 1/2.

Witvrouw et al., A Comparison Between Wet HF Etching and Vapor HF Etching for Sacrificial Oxide Removal, SPIE vol. 4174 (2000), pp. 130-141.

Hautala, J., et al., "Infusion Processing: An Alternative to Plasma Technology for Semiconductor Device Manufacturing", Proceedings of the Electrochemical Society, Symposium on ULSI Process Integration IV (Quebec PR, Canada, May 16-20, 2005), 2005, vol. 6, pp. 118-130.

Shao et al., "Nitrogen gas-cluster ion beam—A new nitrogen source for GaN growth", Mat. Res. Soc. Symp. Proc., 2003, vol. 743, pp. 97-102.

Isao Yamada et al., "Materials Processing by Gas Cluster Ion Beams", Materials Science and Engineering Reports, vol. 34, Issue 6, pp. 231-295, Oct. 30, 2001 (ISSN 09S7-796X).

Saitoh, Y. et al., Acceleration of cluster and molecular ions by TIARA 3 MV tandem accelerator, vol. 452, No. 1-2, Sep. 21, 2000, pp. 61-66, XP004210610, ISSN: 0168-9002.

Yamada, I. et al., Surface modification with gas cluster ion beams, Nuclear Instruments & Methods in Physics Research, vol. B79, Nov. 2, 1992, pp. 223-226, XP001031961, ISSN: 0168-583X.

Baker, S.H. et al., The construction of a gas aggregation source for the preparation of size-selected nanoscale transition metal clusters; Review of Scientific Instruments, AIP, Aug. 1, 2000, pp. 3178-3183, vol. 71, No. 8, XP012038462, ISSN: 0034-6748, Melville, NY.

U.S. Patent and Trademark Office, Non-final Office Action issued in copending U.S. Appl. No. 12/428,973 dated Mar. 27, 2012, 46 pp.

* cited by examiner

US 8,338,806 B2

GAS CLUSTER ION BEAM SYSTEM WITH RAPID GAS SWITCHING APPARATUS

CROSS-REFERENCE TO RELATED APPLICATIONS

This application is related to co-pending U.S. Nonprovisional patent application Ser. No. 12/428,945, entitled "MULTIPLE NOZZLE GAS CLUSTER ION BEAM SYSTEM" (Ref. No. EP-166), filed Apr. 23, 2009, which is based on and claims the benefit of and priority to U.S. Provisional Patent Application No. 61/149,930, entitled "MULTIPLE NOZZLE GAS CLUSTER ION BEAM SYSTEM AND A METHOD OF OPERATION" (Ref. No. EP-166 PROV), filed on Feb. 4, 2009. This application is also related to U.S. Pat. No. 8,173,980, entitled "GAS CLUSTER ION BEAM SYSTEM WITH CLEANING APPARATUS," (Ref. No. EP-171) filed on even date herewith issued May 8, 2012. The entire contents of all of these applications are hereby expressly incorporated by reference herein in their entirety.

BACKGROUND OF THE INVENTION

1. Field of the Invention

The invention generally relates to a system and related methods that utilize one or more nozzles for irradiating substrates using a gas cluster ion beam (GCIB), and more particularly to systems and related methods capable or rapidly changing between different supplies of gas to the one or more nozzles.

2. Description of Related Art

Gas cluster ion beams (GCIB's) are used for doping, etching, cleaning, smoothing, and growing or depositing layers on a substrate. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion. The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

Conventional GCIB systems produce beams of clusters from a variety of gases, such as helium, neon, argon, krypton, xenon, nitrogen, oxygen, carbon dioxide, sulfur hexafluoride, nitric oxide, nitrous oxide, and mixtures of these gases. Several emerging applications for GCIB processing of substrates on an industrial scale are in the semiconductor field. Although GCIB processing of a substrate is performed using a wide variety of gas cluster source gases, many of which are inert gases, many semiconductor processing applications use reactive source gases, sometimes in combination or mixture with inert or noble gases, to form the GCIB. Certain gas or gas mixture combinations are incompatible with one another due to their reactivity. Moreover, GCIB processes sometimes involve changing the supply of gas to one or more nozzles emitting the gas cluster beams. In order to provide for such changes between supplies of gas, it is sometimes necessary to substantially evacuate one gas from all gas-holding volumes immediately upstream of the one or more nozzles before a second, incompatible gas can be supplied to the one or more nozzles. A need therefore exists for GCIB systems and related methods capable of changing the supply of gas between different supplies as rapidly as possible, to thereby minimize downtime associated with such changes.

SUMMARY OF THE INVENTION

In one embodiment, a processing system is provided for irradiating a substrate with a gas cluster ion beam (GCIB). The system includes a nozzle for forming and emitting gas cluster beams through an outlet, and a stagnation chamber that is located upstream of and adjacent the nozzle. The stagnation chamber has an inlet, and the nozzle is configured to direct a gas cluster beam toward the substrate. An ionizer is positioned downstream of the nozzle outlet and is configured to ionize the gas cluster beam to form the GCIB. The system also includes a first gas supply in fluid communication with the inlet of the stagnation chamber, and which has a first gas source and a first valve located between the first gas source and the nozzle for controlling flow of a first gas between the first gas source and the nozzle.

A second gas supply is in fluid communication with the inlet of the stagnation chamber and includes a second gas source and a second valve located between the second gas source and the stagnation chamber. The second valve controls flow of a second gas between the second gas source and the nozzle. The first and second valves are positioned so as to define a common gas-holding volume that is less that about 2 $cm^3$ between the first and second valves and the inlet of the stagnation chamber, and are actuatable to permit selective supply to the nozzle of the first gas or the second gas from their respective gas sources.

In another embodiment, a processing system is provided for irradiating a substrate with a GCIB. The system has at least a first nozzle and a second nozzle for forming and emitting gas cluster beams through respective first and second outlets of the nozzles. First and second stagnation chambers are located upstream of and adjacent the first and second nozzles, respectively, and have respective first and second inlets. The first and second nozzles are arranged in mutually close proximity to one another to at least partially coalesce the gas cluster beams emitted therefrom into a single gas cluster beam, and to direct the single gas cluster beam toward the substrate. An ionizer is positioned downstream of the nozzle outlets and is configured to ionize the single gas cluster beam to form the GCIB. The system also has a first gas supply in fluid communication with the first and second inlets of the first and second stagnation chambers, with the first gas supply including a first gas source and a first pair of valves between the first gas source and each of the first and second nozzles for controlling flow of a first gas between the first gas source and the first and second nozzles, respectively.

A second gas supply is in fluid communication with the first and second inlets of the first and second stagnation chambers. The second gas supply includes a second gas source and a second pair of valves between the second gas source and each of the first and second nozzles for controlling flow of a second gas between the second gas source and each of the first and second nozzles, respectively. The first and second pairs of valves are positioned so as to define a first common gas holding volume between one of the valves of each of the first and second pairs, and the first inlet of the first stagnation chamber. A second common gas holding volume is defined between the other of the valves of each of the first and second pairs and the second inlet of the second stagnation chamber. At least one of the first or second common gas holding volumes is less than about 2 cm$^3$. Actuation of the first and second pairs of valves is effective to permit selective supply of the first or second gases, respectively, from the respective gas sources to the first or second nozzle.

In yet another embodiment, a method is provided for supplying gas in a processing system that is used to irradiate a substrate with a GCIB. The method includes supplying a first gas from a first gas source to a nozzle through a first valve and through an inlet of a stagnation chamber that is located upstream of and adjacent the nozzle. The first valve is in fluid communication with a second valve that is fluidly coupled to a second gas source such that the first valve, the second valve, and the inlet of the stagnation chamber jointly define a common gas holding volume there between that is less than about 2 cm$^3$. The nozzle is configured to form and emit a gas cluster beam through an outlet thereof, and to direct the gas cluster beam toward the substrate. The method also includes directing the gas cluster beam through an ionizer that ionizes the gas cluster beam to form the GCIB. The first valve is closed to thereby interrupt flow of the first gas from the first gas source to the nozzle, and the first gas from the common gas holding volume and from the stagnation chamber is evacuated through an evacuation valve. The second valve is opened to supply a second gas from the second gas source to the nozzle through the common gas holding volume.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIGS. 5-9 are schematics representations of various embodiments of the multiple nozzle assembly, comprising multiple nozzles, single or multiple gas supplies, and having various gas flow interconnections provided there between.

DETAILED DESCRIPTION OF EXEMPLARY EMBODIMENTS

In the following description, in order to facilitate a thorough understanding of the invention and for purposes of explanation and not limitation, specific details are set forth, such as a particular geometry of the metrology system and descriptions of various components and processes. However, it should be understood that the invention may be practiced in other embodiments that depart from these specific details.

Figure 1:
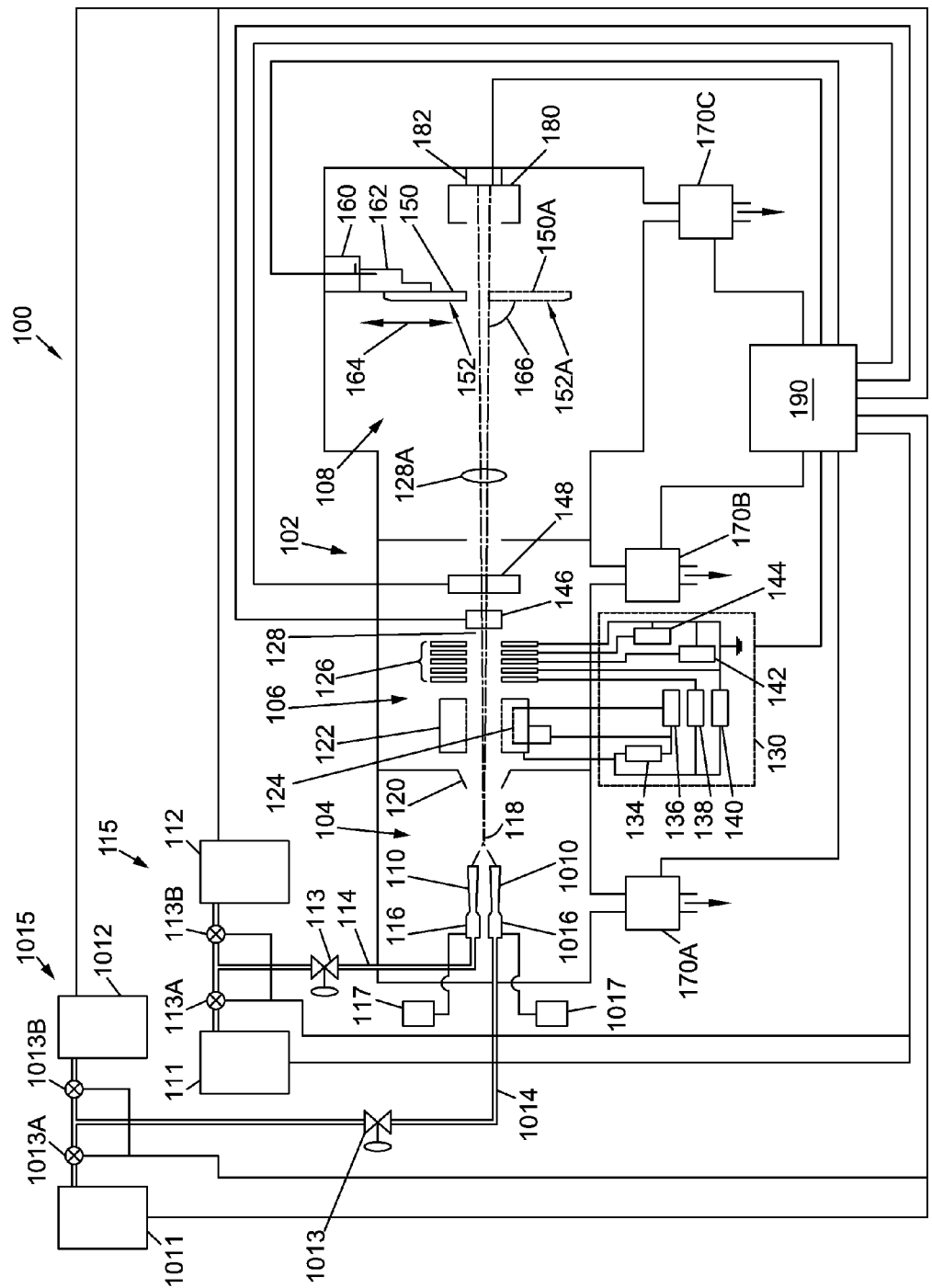
FIG. 1 is a schematic representation of a multiple nozzle GCIB system in accordance with an embodiment of the invention.

Referring now to FIG. 1, a GCIB processing system 100 for modifying, depositing, growing, or doping a layer is depicted according to an embodiment. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 1, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and accelerated. Then, in the third chamber (processing chamber 108), the accelerated GCIB may be utilized to treat substrate 152.

In the exemplary embodiment of FIG. 1, GCIB processing system 100 comprises two gas supplies 115, 1015 and two nozzles 110, 1010. Additional embodiments will be discussed later having numbers of nozzles different than two, and numbers of gas supplies different than two, all of which fall within the scope of the invention. Each of the two gas supplies 115 and 1015 is connected to one of two stagnation chambers 116 and 1016, and nozzles 110 and 1010, respectively. The first gas supply 115 comprises a first gas source 111, a second gas source 112, a first gas control valve 113A, a second gas control valve 113B, and a gas metering valve 113. For example, a first gas composition stored in the first gas source 111 is admitted under pressure through a first gas control valve 113A to the gas metering valve or valves 113. Additionally, for example, a second gas composition stored in the second gas source 112 is admitted under pressure through the second gas control valve 113B to the gas metering valve or valves 113. Further, for example, the first gas composition or second gas composition, or both, of first gas supply 115 can include a condensable inert gas, carrier gas or dilution gas. For example, the inert gas, carrier gas or dilution gas can include a noble gas, i.e., He, Ne, Ar, Kr, Xe, or Rn.

Similarly, the second gas supply 1015 comprises a first gas source 1011, a second gas source 1012, a first gas control valve 1013A, a second gas control valve 1013B, and a gas metering valve 1013. For example, a first gas composition stored in the first gas source 1011 is admitted under pressure through the first gas control valve 1013A to the gas metering valve or valves 1013. Additionally, for example, a second gas composition stored in the second gas source 1012 is admitted under pressure through the second gas control valve 1013B to the gas metering valve or valves 1013. Further, for example, the first gas composition or second gas composition, or both, of second gas supply 1015 can include a condensable inert gas, carrier gas or dilution gas. For example, the inert gas, carrier gas or dilution gas can include a noble gas, i.e., He, Ne, Ar, Kr, Xe, or Rn.

Furthermore, the first gas sources 111 and 1011, and the second gas sources 112 and 1012 are each utilized to produce ionized clusters. The material compositions of the first and second gas sources 111, 1011, 112, and 1012 include the principal atomic (or molecular) species, i.e., the first and second atomic constituents desired to be introduced for doping, depositing, modifying, or growing a layer.

The high pressure, condensable gas comprising the first gas composition and/or the second gas composition is introduced from the first gas supply 115 through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and a gas cluster beam emanates from nozzle 110.

Similarly, the high pressure, condensable gas comprising the first gas composition and/or the second gas composition is introduced from the second gas supply 1015 through gas feed tube 1014 into stagnation chamber 1016 and is ejected into the substantially lower pressure vacuum through a properly shaped nozzle 1010. As a result of the expansion of the high pressure, condensable gas from the stagnation chamber 1016 to the lower pressure region of the source chamber 104, the gas velocity accelerates to supersonic speeds and a gas cluster beam emanates from nozzle 1010.

Nozzles 110 and 1010 are mounted in such close proximity that the individual gas cluster beams generated by the nozzles 110, 1010 substantially coalesce in the vacuum environment of source chamber 104 into a single gas cluster beam 118 before reaching the gas skimmer 120. The chemical composition of the gas cluster beam 118 represents a mixture of compositions provided by the first and second gas supplies 115 and 1015, injected via nozzles 110 and 1010.

The inherent cooling of the jet as static enthalpy is exchanged for kinetic energy, which results from the expansion in the jets, causes a portion of the gas jets to condense and form a gas cluster beam 118 having clusters, each consisting of from several to several thousand weakly bound atoms or molecules. A gas skimmer 120, positioned downstream from the exit of nozzles 110 and 1010 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

The first and second gas supplies 115 and 1015 can be configured to independently control stagnation pressures and temperatures of gas mixtures introduced to stagnation chambers 116 and 1016. Temperature control can be achieved by the use of suitable temperature control systems (e.g. heaters and/or coolers) in each gas supply (not shown). In addition, a manipulator 117 may be mechanically coupled to nozzle 110, for example via the stagnation chamber 116, the manipulator 117 being configured to position the coupled nozzle 110 with respect to the gas skimmer 120, independent of nozzle 1010. Likewise, a manipulator 1017 may be mechanically coupled to nozzle 1010, for example via the stagnation chamber 1016, the manipulator 1017 being configured to position the coupled nozzle 1010 with respect to the gas skimmer 120, independent of nozzle 110. Thus each nozzle in a multi-nozzle assembly may be separately manipulated for proper positioning vis-à-vis the single gas skimmer 120.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 1, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 1, the beam electronics 130 further include an anode power supply 134 that provides voltage $V_A$ to an anode of ionizer 122 for accelerating electrons emitted from ionizer filament 124 and causing the electrons to bombard the gas clusters in gas cluster beam 118, which produces cluster ions.

Additionally, as illustrated in FIG. 1, the beam electronics 130 include an extraction power supply 138 that provides voltage $V_E$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{Acc}$ to bias one of the high voltage electrodes 126 with respect to the ionizer 122 so as to result in a total GCIB acceleration energy equal to about $V_{Acc}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{Acc}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered processing GCIB 128A that enters the processing chamber 108. In one embodiment, the beam filter 146 substantially reduces the number of clusters having 100 or less atoms or molecules or both. The beam filter 146 may comprise a magnet assembly for imposing a magnetic field across the GCIB 128 to aid in the filtering process.

Referring still to FIG. 1, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define processing GCIB 128A, and a closed state in which the GCIB 128 is blocked from entering the processing chamber 108. A control cable conducts control signals from controller 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the processing GCIB 128A in the processing chamber 108. Because most applications contemplate the processing of large substrates with spatially uniform results, a scanning system may be desirable to uniformly scan the processing GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through processing GCIB 128A to cause a uniform (or otherwise programmed) irradiation of a surface of the substrate 152 by the processing GCIB 128A for processing of the substrate 152.

The substrate holder 150 disposes the substrate 152 at an angle with respect to the axis of the processing GCIB 128A so that the processing GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the processing GCIB 128A, and in both extreme positions, is moved completely out of the path of the processing GCIB 128A (over-scanned). Though not shown explicitly in FIG. 1, similar scanning and over-scan is performed in the (typically) orthogonal X-scan motion direction (in and out of the plane of the paper).

A beam current sensor 180 may be disposed beyond the substrate holder 150 in the path of the processing GCIB 128A so as to intercept a sample of the processing GCIB 128A when the substrate holder 150 is scanned out of the path of the processing GCIB 128A. The beam current sensor 180 is typically a faraday cup or the like, closed except for a beam-entry opening, and is typically affixed to the wall of the vacuum vessel 102 with an electrically insulating mount 182.

As shown in FIG. 1, controller 190 connects to the X-scan actuator 160 and the Y-scan actuator 162 through electrical cable and controls the X-scan actuator 160 and the Y-scan actuator 162 in order to place the substrate 152 into or out of the processing GCIB 128A and to scan the substrate 152 uniformly relative to the processing GCIB 128A to achieve desired processing of the substrate 152 by the processing GCIB 128A. Controller 190 receives the sampled beam current collected by the beam current sensor 180 by way of an electrical cable and, thereby, monitors the GCIB and controls the GCIB dose received by the substrate 152 by removing the substrate 152 from the processing GCIB 128A when a predetermined dose has been delivered.

Figure 2:
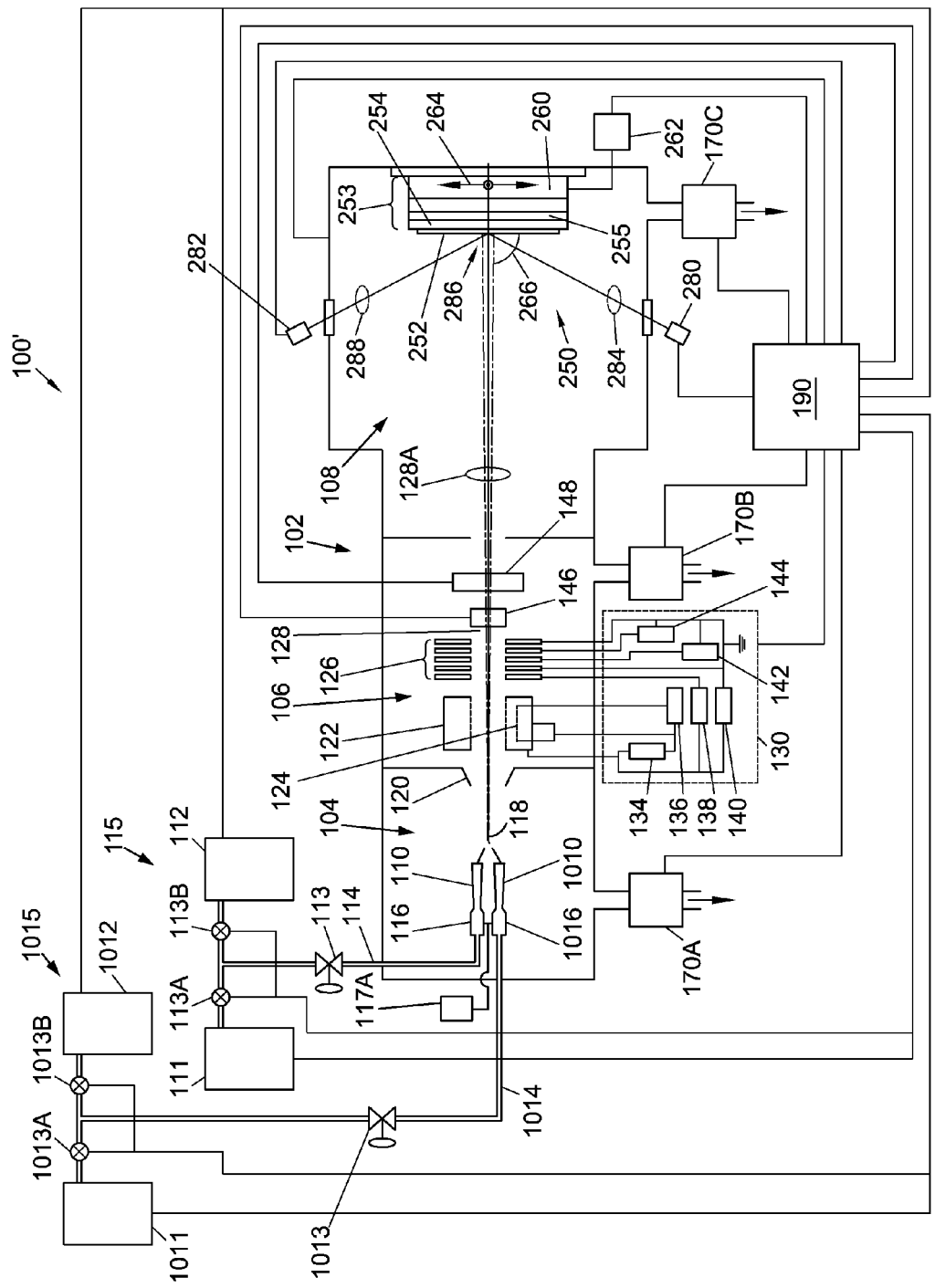
FIG. 2 is a schematic representation of a multiple nozzle GCIB system in accordance with another embodiment of the invention.

In the embodiment shown in FIG. 2, the GCIB processing system 100' can be similar to the embodiment of FIG. 1 and further comprise a X-Y positioning table 253 operable to hold and move a substrate 252 in two axes, effectively scanning the substrate 252 relative to the processing GCIB 128A. For example, the X-motion can include motion into and out of the plane of the paper, and the Y-motion can include motion along direction 264.

The processing GCIB 128A impacts the substrate 252 at a projected impact region 286 on a surface of the substrate 252, and at an angle of beam incidence 266 with respect to the surface of substrate 252. By X-Y motion, the X-Y positioning table 253 can position each portion of a surface of the substrate 252 in the path of processing GCIB 128A so that every region of the surface may be made to coincide with the projected impact region 286 for processing by the processing GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, controller 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the controller 190 to scan, with programmable velocity, any portion of the substrate 252 through the projected impact region 286 for GCIB processing by the processing GCIB 128A.

The substrate holding surface 254 of positioning table 253 is electrically conductive and is connected to a dosimetry processor operated by controller 190. An electrically insulating layer 255 of positioning table 253 isolates the substrate 252 and substrate holding surface 254 from the base portion 260 of the positioning table 253. Electrical charge induced in the substrate 252 by the impinging processing GCIB 128A is conducted through substrate 252 and substrate holding surface 254, and a signal is coupled through the positioning table 253 to controller 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the processing GCIB 128A. In such case, a Faraday cup (not shown, but which may be similar to beam current sensor 180 in FIG. 1) may be used to assure accurate dosimetry despite the added source of electrical charge, the reason being that typical Faraday cups allow only the high energy positive ions to enter and be measured.

In operation, the controller 190 signals the opening of the beam gate 148 to irradiate the substrate 252 with the processing GCIB 128A. The controller 190 monitors measurements of the GCIB current collected by the substrate 252 in order to compute the accumulated dose received by the substrate 252. When the dose received by the substrate 252 reaches a predetermined dose, the controller 190 closes the beam gate 148 and processing of the substrate 252 is complete. Based upon measurements of the GCIB dose received for a given area of the substrate 252, the controller 190 can adjust the scan velocity in order to achieve an appropriate beam dwell time to treat different regions of the substrate 252.

Alternatively, the processing GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the controller 190. The optical receiver 282 returns measurement signals to the controller 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from controller 190, the in-situ metrology system can map one or more characteristics of the substrate 252.

Figure 3:
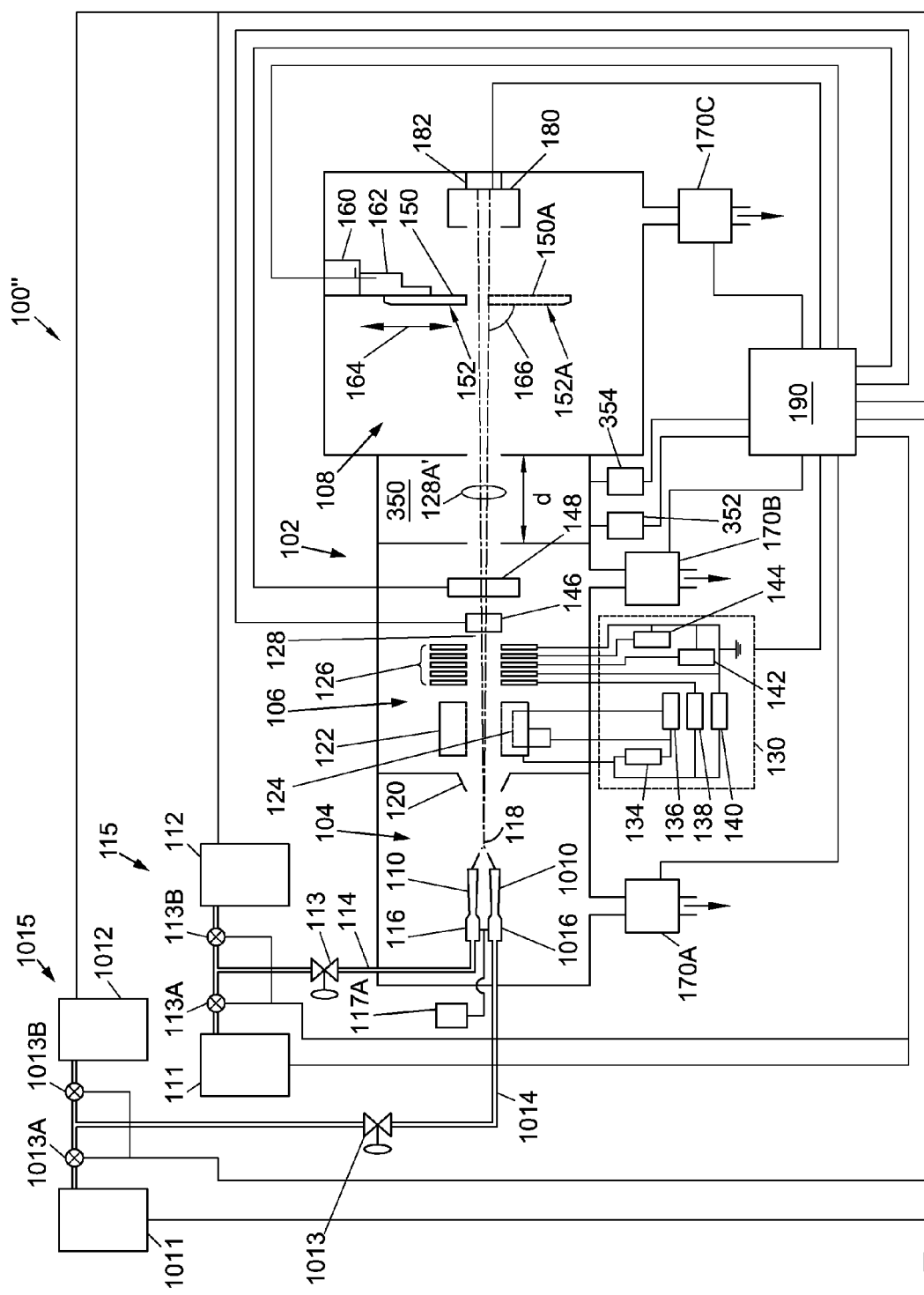
FIG. 3 is a schematic representation of a multiple nozzle GCIB system in accordance with yet another embodiment of the invention.

In the embodiment shown in FIG. 3, the GCIB processing system 100" can be similar to the embodiment of FIG. 1 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configured to measure the elevated pressure in the pressure cell chamber 350.

The pressure cell chamber 350 may be configured to modify the beam energy distribution of GCIB 128 to produce a modified processing GCIB 128A'. This modification of the beam energy distribution is achieved by directing GCIB 128 along a GCIB path through an increased pressure region within the pressure cell chamber 350 such that at least a portion of the GCIB traverses the increased pressure region. The extent of modification to the beam energy distribution may be characterized by a pressure-distance integral along at least a portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled METHOD AND APPARATUS FOR IMPROVED PROCESSING WITH A GAS-CLUSTER ION BEAM; the content of which is incorporated herein by reference in its entirety.

Controller 190 comprises a microprocessor, memory, and a digital I/O port capable of generating control voltages sufficient to communicate and activate inputs to GCIB processing system 100 (or 100', 100"), as well as monitor outputs from GCIB processing system 100 (or 100', 100"). Moreover, controller 190 can be coupled to and can exchange information with vacuum pumping systems 170A, 170B, and 170C, first gas sources 111 and 1011, second gas sources 112 and 1012, first gas control valves 113A and 1013A, second gas control valves 113B and 1013B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the controller 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 190 can be used to configure any number of processing elements, as described above, and the controller 190 can collect, provide, process, store, and display data from processing elements. The controller 190 can include a number of applications, as well as a number of controllers, for controlling one or more of the processing elements. For example, controller 190 can include a graphic user interface (GUI) component (not shown) that can provide interfaces that enable a user to monitor and/or control one or more processing elements.

Controller 190 can be locally located relative to the GCIB processing system 100 (or 100', 100"), or it can be remotely located relative to the GCIB processing system 100 (or 100', 100"). For example, controller 190 can exchange data with GCIB processing system 100 using a direct connection, an intranet, and/or the internet. Controller 190 can be coupled to an intranet at, for example, a customer site (i.e., a device maker, etc.), or it can be coupled to an intranet at, for example, a vendor site (i.e., an equipment manufacturer). Alternatively or additionally, controller 190 can be coupled to the internet. Furthermore, another computer (i.e., controller, server, etc.) can access controller 190 to exchange data via a direct connection, an intranet, and/or the internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Also shown in FIGS. 2 and 3 is an alternative embodiment for a nozzle manipulator. Rather than each nozzle 110, 1010 being coupled to a separately operable manipulator 117, 1017 as in FIG. 1, the nozzles 110, 1010 may be coupled to each other, and together coupled to a single manipulator 117A. The position of the nozzles 110, 1010 vis-à-vis the gas skimmer 120 can then be manipulated collectively as a set rather than individually.

Figure 4:
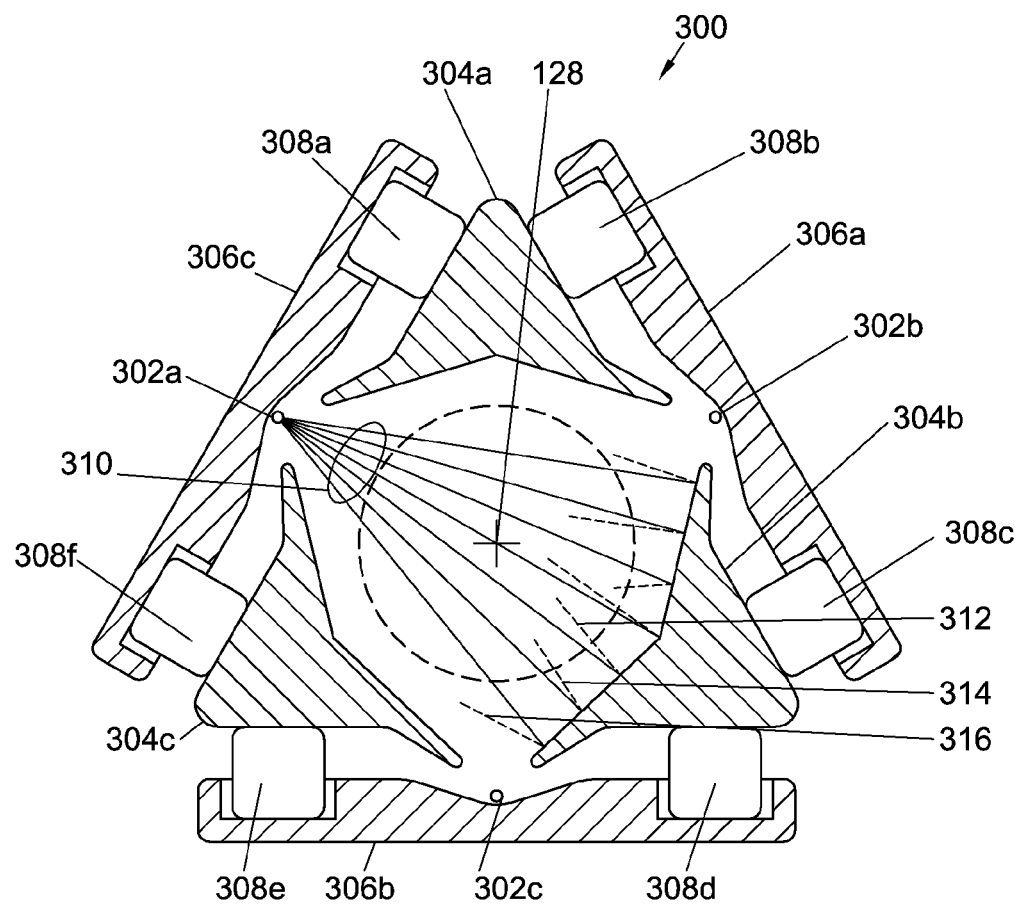
FIG. 4 is a schematic representation of an embodiment of an ionizer for use in a GCIB system.

Referring now to FIG. 4, a section 300 of a gas cluster ionizer (122, FIGS. 1, 2 and 3) for ionizing a gas cluster jet (gas cluster beam 118, FIGS. 1, 2 and 3) is shown. The section 300 is normal to the axis of GCIB 128. For typical gas cluster sizes (2000 to 15000 atoms), clusters leaving the gas skimmer aperture (120, FIGS. 1, 2 and 3) and entering an ionizer (122, FIGS. 1, 2 and 3) will travel with a kinetic energy of about 130 to 1000 electron volts (eV). At these low energies, any departure from space charge neutrality within the ionizer 122 will result in a rapid dispersion of the jet with a significant loss of beam current. FIG. 4 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Alternatively, ionizers may use electron extraction from plasma to ionize clusters. The geometry of these ionizers is quite different from the three filament ionizer described here but the principles of operation and the ionizer control are very similar. For example, the ionizer design may be similar to the ionizer described in U.S. Pat. No. 7,173,252, entitled IONIZER AND METHOD FOR GAS-CLUSTER ION-BEAM FORMATION; the content of which is incorporated herein by reference in its entirety.

The gas cluster ionizer (122, FIGS. 1, 2 and 3) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

Figure 5:
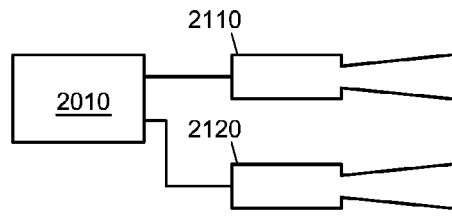

With reference now to FIGS. 5-9, therein are depicted various embodiments of the multiple nozzle and gas supply assembly of GCIB processing system 100 (or 100', 100") of FIGS. 1, 2, and 3, respectively. FIG. 5 depicts an embodiment of a multiple nozzle and gas supply assembly comprising a single gas supply 2010 and two nozzles 2110 and 2120, fed by gas supply 2010. Like, for example, the first gas supply 115 of GCIB processing system 100 of FIG. 1, gas supply 2010 (and all other gas supplies of FIGS. 5-9) may comprise a first gas source, a second gas source, a first gas control valve, a second gas control valve, and a gas metering valve to allow the formation of a gas mixture composed of gases provided by the first and second gas sources, or alternatively to flow only one gas from the first or second gas source. The multiple nozzle and gas supply assembly of FIG. 5 is suitable for GCIB applications where a large gas flow is required of a single gas or gas mixture, necessitating the use of multiple nozzles, so identical or similar stagnation conditions (i.e. pressure and temperature) can be maintained inside stagnation chambers preceding the nozzles, and identical or similarly-sized nozzles can be utilized as those in a prior art single gas supply and single nozzle GCIB system.

Figure 6:
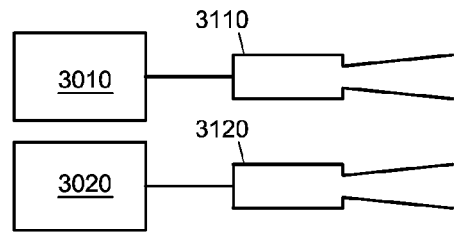

FIG. 6 depicts essentially the embodiment of the multiple nozzle and gas supply assembly of GCIB processing system 100 (or 100', 100") of FIGS. 1, 2, and 3, respectively. The assembly of FIG. 6 comprises two gas supplies 3010 and 3020, and two gas nozzles 3110 and 3120, allowing its use in GCIB applications requiring the formation of gas cluster beams composed of mixtures of incompatible gases and/or pyrophoric gases. Such incompatible gas mixtures cannot be readily premixed in a single gas supply (e.g. gas supply 2010 of FIG. 5) for injection via a single or multiple nozzles, due to at least adverse chemical reactions that would occur between the incompatible gas mixture components inside the parts and piping of the single gas supply. The multiple nozzle and gas supply assembly of FIG. 6 overcomes this issue by providing independent gas supplies 3010, 3020 for the incompatible and/or pyrophoric gas mixture components, which are only mixed upon injection from nozzles 3110 and 3120 mounted in mutual close proximity so as to at least partially coalesce and produce a single gas cluster beam. A further advantage is that different dilution gases may be used in the different gas mixtures, for example, a first gas mixture may use He as a dilution gas, while a second gas mixture may use Ar. It is also possible to configure gas supplies 3010 and 3020 of the multiple nozzle and gas supply system of FIG. 6 to flow gas mixtures of the same composition to nozzles 3110 and 3120. Furthermore, the multiple nozzle and gas supply assembly of FIG. 6 allows the injection of gas mixtures at different stagnation pressures and/or temperatures, from nozzles 3110 and 3120, for example, if optimum cluster nucleation conditions of gas mixtures are different, and therefore require different stagnation conditions. Stagnation pressure control is achieved generally by setting the gas metering valve of a gas supply, while stagnation temperature control may be achieved by the use of suitable heaters or cooling devices (not shown).

Figure 7:
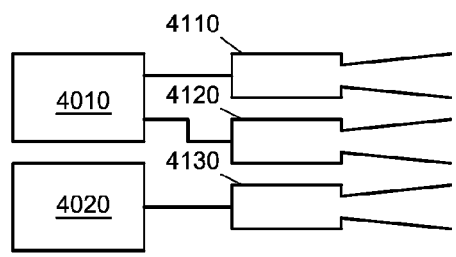
Figure 8:
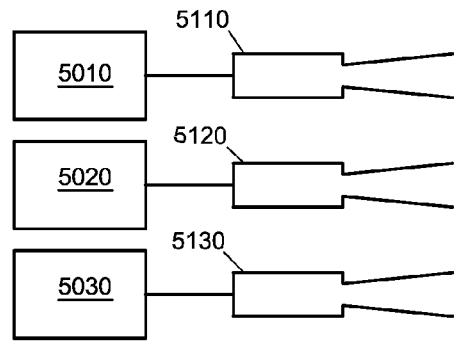
Figure 9:
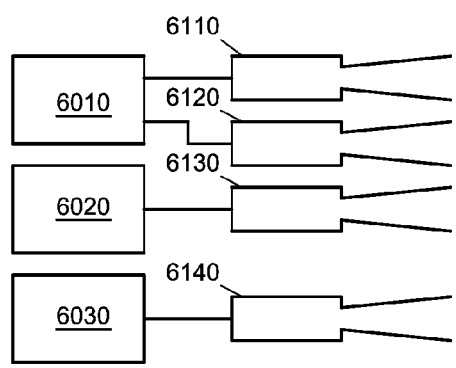

FIG. 7 depicts a multiple nozzle and gas supply assembly similar to that of FIGS. 5 and 6 combined, comprising gas supplies 4010 and 4020, and three nozzles 4110, 4120, and 4130, wherein gas supply 4010 supplies two nozzles, 4110 and 4120 respectively, allowing higher flow rates of one gas mixture, while gas supply 4020 supplies only nozzle 4130. This configuration is suitable for applications requiring high flow rates of one gas mixture component, while retaining the ability to handle incompatible and/or pyrophoric gases. FIG. 8 depicts a similar embodiment to that of FIG. 6, extended to comprise three gas supplies 5010, 5020, and 5030, and three nozzles 5110, 5120, and 5130, allowing independent introduction of three different gas mixtures to the nozzles, if a GCIB process so requires. FIG. 9 depicts a similar assembly to that of FIGS. 5 and 8 combined, comprising three gas supplies 6010, 6020, and 6030, and four nozzles 6110, 6120, 6130, and 6140, wherein gas supply 6010 is connected to nozzles 6110 and 6120, allowing high gas mixture flow rates therethrough, with the ability to independently provide an additional two gas mixture components.

While embodiments of FIGS. 5-9 can, as process conditions may demand, be set to simultaneously flow multiple gases or gas mixtures to the individual nozzles, it is also possible to operate the multiple gas supplies and nozzles in a sequential manner, wherein in a sequence of process steps, at least one step is used that involves simultaneously flowing multiple gases or gas mixtures. For example, in the embodiment of FIG. 6, a first GCIB process step may involve flowing only a single gas or gas mixture, generated by gas supply 3010, and introduced via nozzle 3110, and a second process step may involve first and second gases or gas mixtures, generated by gas supplies 3010 and 3020, and introduced via nozzles 3110 and 3120, respectively.

It is immediately apparent that other embodiments of the multiple nozzle and gas supply assembly are possible, comprising different numbers of nozzles (e.g. higher than four), and different numbers of gas supplies (e.g. higher than three) some of which may be connected to multiple nozzles to accommodate high flow rates, all of which embodiments fall within the scope of the invention.

FIGS. 10A-12B are cross-sectional schematics depicting various spatial arrangements of multiple nozzles, and various cross-sectional shapes of a single gas skimmer to be used with a particular nozzle arrangement. The mutual close proximity of nozzles within the assembly ensure that the individual gas cluster beams leaving the nozzles substantially or at least partially coalesce into a single gas cluster beam before reaching the gas skimmer. The coalescence of gas cluster beams into a single gas cluster beam before reaching the gas skimmer allows the use of same GCIB system components downstream of the gas skimmer as in a prior art single gas supply and single nozzle GCIB system. Given that these downstream components may be the same, it is envisioned that an existing GCIB system can be converted into a multi-nozzle system, with multiple gas supplies, with relatively little modification and/or parts replacement, primarily in the source chamber area of a GCIB system.

Figure 10A:
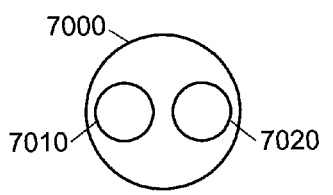
FIGS. 10A-12B are cross-sectional views of various embodiments of the multiple nozzle assembly depicting various arrangements of multiple nozzles, and having various gas skimmer cross-sectional shapes to accommodate the various nozzle arrangements.
Figure 10B:
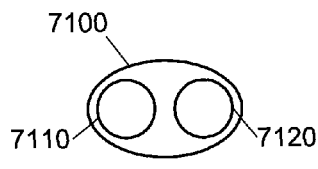
Figure 10C:
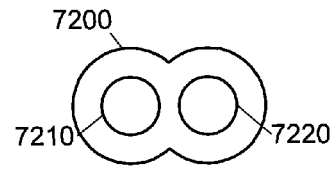
Figure 11A:
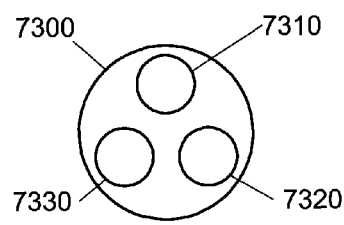
Figure 11B:
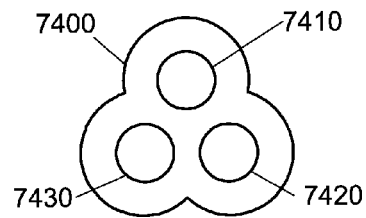
Figure 12A:
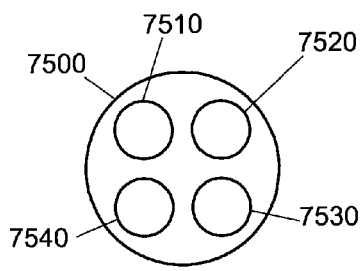
Figure 12B:
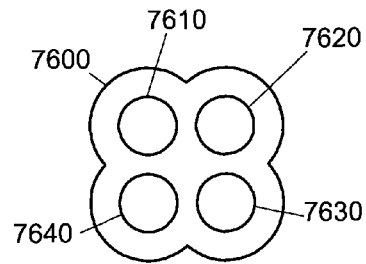

FIG. 10A depicts a multiple nozzle assembly comprising two nozzles 7010 and 7020, seen in cross section, mounted side by side (or alternatively oriented vertically one above the other) forming a gas cluster beam which passes through a gas skimmer 7000 of substantially circular cross section. FIG. 10B depicts a similar dual nozzle assembly with an oval or elliptical gas skimmer 7100, aligned with nozzles 7110 and 7120. FIG. 10C depicts a dual nozzle assembly with a twin lobed gas skimmer 7200, aligned with nozzles 7210 and 7220. The embodiments of FIGS. 10A-C can readily be extended to assemblies with larger numbers of nozzles. For example, FIG. 11A depicts an assembly with three nozzles 7310, 7320, and 7330 injecting a gas cluster beam through a substantially circular gas skimmer 7300. FIG. 11B depicts a similar three-nozzle assembly, but with a three-lobed gas skimmer 7400, aligned with the nozzles 7410, 7420, and 7430. In similar vein, FIGS. 12A-B extend the concept to an assembly with four nozzles 7510, 7520, 7530 and 7540, and four nozzles 7610, 7620, 7630 and 7640, respectively, injecting a gas cluster beam through a substantially circular gas skimmer 7500 and four-lobed gas skimmer, 7600, respectively. Other embodiments can be readily envisioned, all of which fall within the scope of the invention.

Figure 13A:
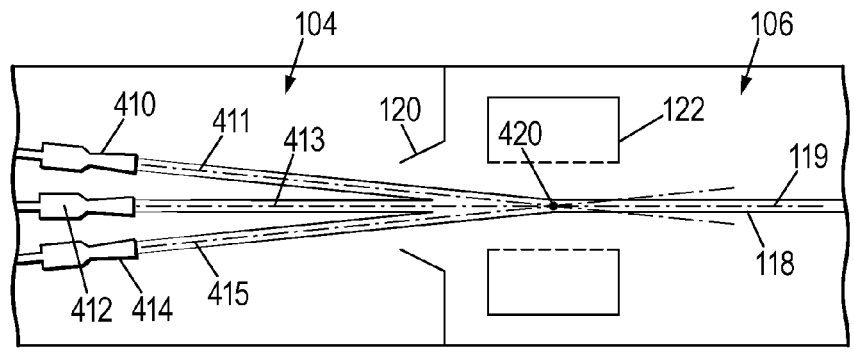
FIG. 13A-D are schematic representations of various embodiments of a multiple nozzle assemblies with nozzles mounted at an inwards pointing angle such that gas cluster beams intersect at a point along the main GCIB axis.
Figure 13B:
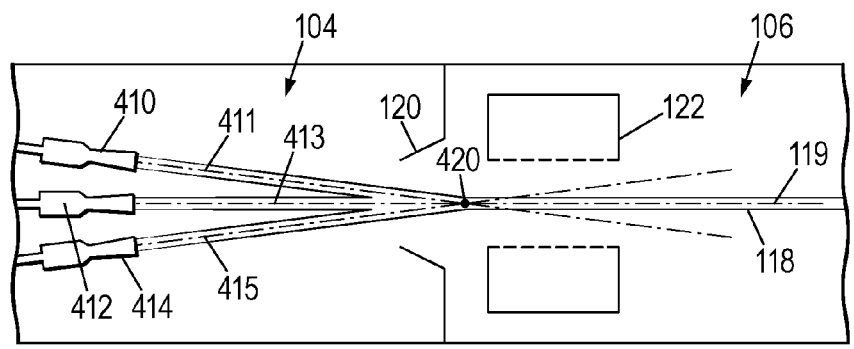
Figure 13C:
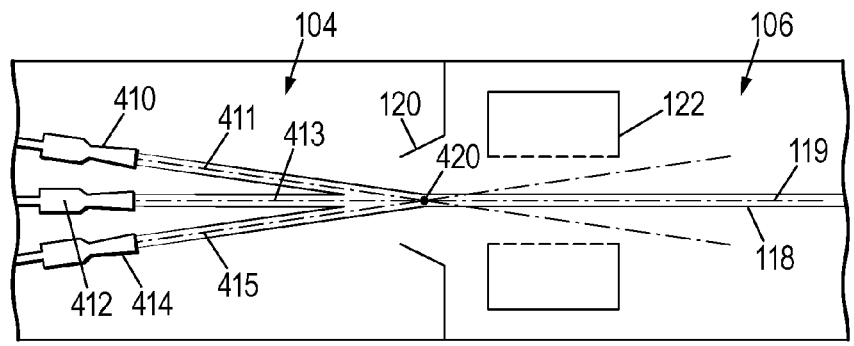
Figure 13D:
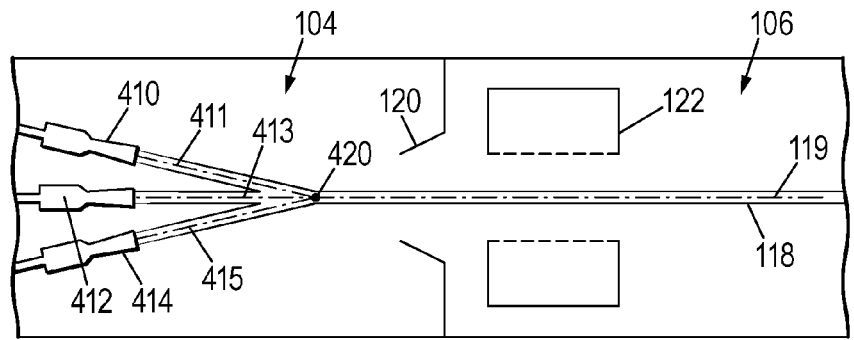

Furthermore, as depicted in partial schematic view in FIGS. 13A-13D, to assist in gas cluster beam coalescence, the nozzles (three nozzles 410, 412, 414 are shown, but the invention is not so limited) can be mounted at a slight angle pointing towards a single intersecting point 420 along the beam axis 119 of gas cluster beam 118 of FIGS. 1, 2 and 3. For example, the gas cluster beam axes 411, 413, 415 of the individual nozzles 410, 412, 414 can intersect at a single intersecting point 420 along beam axis 119 inside the ionizer 122 (e.g., of GCIB processing system 100 of FIG. 1), as depicted in FIG. 13A. Alternatively, the gas cluster beam axes 411, 413, 415 of the individual nozzles 410, 412, 414 can intersect at a single intersecting point 420 along beam axis 119 downstream of the gas skimmer 120 but upstream of the ionizer 122, as depicted in FIG. 13B. In another alternative, the gas cluster beam axes 411, 413, 415 of the individual nozzles 410, 412, 414 can intersect at a single intersecting point 420 along beam axis 119 between an input and an output of the gas skimmer 120, as depicted in FIG. 13C. Alternatively yet, the gas cluster beam axes 411, 413, 415 of the individual nozzles 410, 412, 414 can intersect at a single intersecting point 420 along beam axis 119 between the output of the nozzles 410, 412, 414 and the input of the gas skimmer 120, as depicted in FIG. 13D. The inward slant angle, i.e. deviation from parallel orientation, can range from 0.5 to 10 degrees, or from 0.5 to 5 degrees, or from 1 to 2 degrees.

Figure 14:
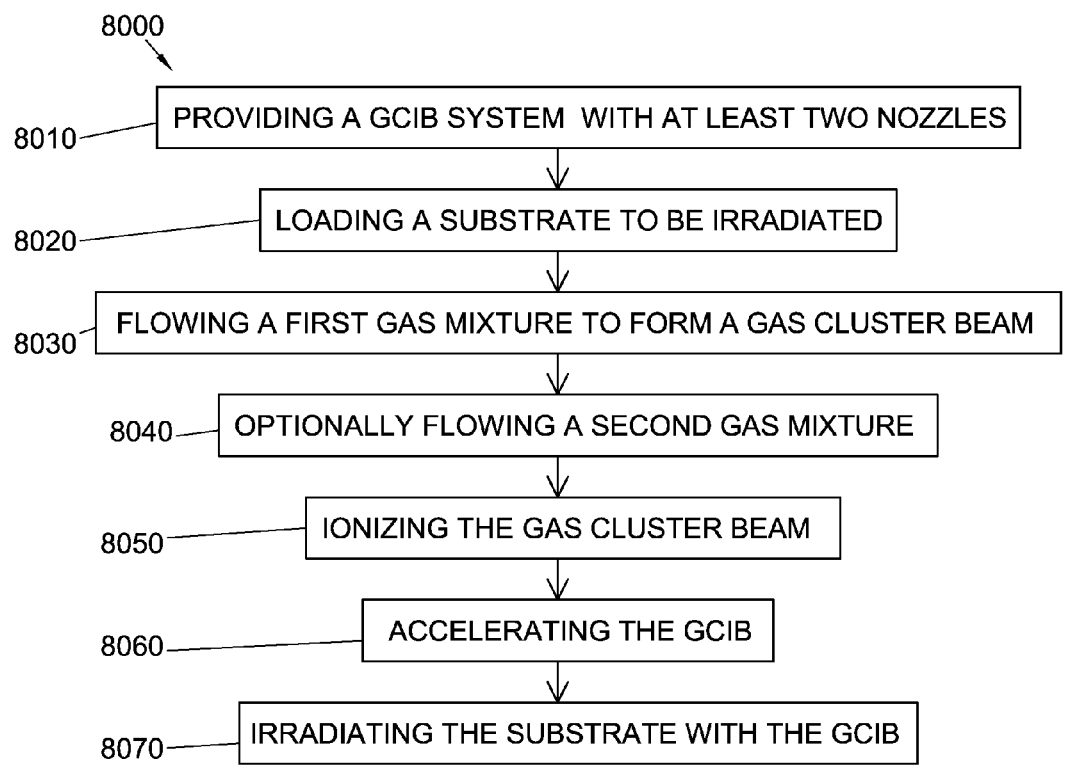
FIG. 14 is a flowchart of an embodiment of a method for operating a GCIB system with multiple nozzles.

Referring now to FIG. 14, a method of irradiating a substrate using a GCIB is illustrated according to an embodiment. The method comprises a flow chart 8000 beginning in 8010 with providing a GCIB processing system with a set of at least two nozzles either arranged in mutual close proximity to ensure coalescence of individual gas cluster beams before reaching a single gas skimmer or arranged so as to have intersecting beam axes, and a first gas supply configured to supply at least a subset of the full set of nozzles (e.g. a single nozzle, or multiple nozzles of the subset) with a gas mixture. The GCIB processing system can be any of the GCIB processing systems (100, 100' or 100") described above in FIG. 1, 2 or 3, or any combination thereof, with any arrangement of nozzles and gas supplies shown in FIGS. 5-13D.

In step 8020, a substrate is loaded into the GCIB processing system. The substrate can include a conductive material, a non-conductive material, or a semi-conductive material, or a combination of two or more thereof. Additionally, the substrate may include one or more material structures formed thereon, or the substrate may be a blanket substrate free of material structures. The substrate can be positioned in the GCIB processing system on a substrate holder and may be securely held by the substrate holder. The temperature of the substrate may or may not be controlled. For example, the substrate may be heated or cooled during a film forming process. The environment surrounding the substrate is maintained at a reduced pressure.

In step 8030, a flow of a first gas mixture is started from the first gas supply. The flow of gas through the nozzle, all nozzles, or subset of nozzles connected to the first gas supply forms a gas cluster beam or a coalesced and/or intersected gas cluster beam, which single beam passes through the single gas skimmer into the ionization chamber of the GCIB processing system.

In step 8040, an optional second gas mixture is introduced from an optional second gas supply into all or a subset of the remaining nozzles (i.e. nozzles not supplied by the first gas supply of step 8010, with the first gas mixture of step 8030). The optional second gas mixture may be the same or different than the first gas mixture, and the gas mixtures, if different, may be incompatible. Additionally, one of the gas mixtures may be pyrophoric. The optional second gas mixture also forms a gas cluster beam or beams that coalesces and/or intersects with the beam or beams from the first nozzle or subset of nozzles to form a single gas cluster beam.

In step 8050, the single gas cluster beam is ionized in an ionizer, such as, for example, ionizer 300 of FIG. 4, to form a gas cluster ion beam (GCIB). In step 8060, the GCIB is accelerated by applying a beam acceleration potential to the GCIB.

In step 8070, the GCIB composed of the first gas mixture, and the optional second gas mixture, is used to irradiate the substrate loaded in the GCIB processing system.

The beam acceleration potential and the beam dose can be selected to achieve the desired properties of a layer affected by irradiation with the GCIB, on the substrate. For example, the beam acceleration potential and the beam dose can be selected to control the desired thickness of a deposited or grown layer, or to achieve a desired surface roughness or other modification of an upper layer atop the substrate, or to control the concentration and depth of penetration of a dopant into the substrate. Herein, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters irradiate the surface of the substrate per unit area (i.e., number of clusters per unit area per unit time) may be held constant while the time is varied to change the beam dose.

Additionally, other GCIB properties may be varied, including, but not limited to, gas flow rates, stagnation pressures, cluster size, or gas nozzle designs (such as nozzle throat diameter, nozzle length, and/or nozzle divergent section half-angle).

The selection of combinations of gases used for the first and optional second gas mixture depends on the process that the substrate is being subjected to. The deposition or growth of a material layer may include depositing or growing a $SiO_x$, $SiN_x$, $SiC_x$, $SiC_xO_y$, $SiC_xN_y$, $BN_x$, $BSi_xN_y$, Ge, SiGe(B), or SiC(P) layer on a substrate or atop an existing layer on a substrate. According to embodiments of the invention, the first or the optional second gas mixture may thus comprise a nitrogen-containing gas, a carbon-containing gas, a boron-containing gas, a silicon-containing gas, a phosphorous-containing gas, a sulfur-containing gas, a hydrogen-containing gas, a silicon-containing gas, or a germanium-containing gas, or a combination of two or more thereof. Examples of gases which may be used to form the first and optional second gas mixture are: He, Ne, Ar, Kr, Xe, Rn, $SiH_4$, $Si_2H_6$, $C_4H_{12}Si$, $C_3H_{10}Si$, $H_3C-SiH_3$, $H_3C-SiH_2-CH_3$, $(CH_3)_3-SiH$, $(CH_3)_4-Si$, $SiH_2Cl_2$, $SiCl_3H$, $SiCl_4$, $SiF_4$, $O_2$, CO, $CO_2$, $N_2$, NO, $NO_2$, $N_2O$, $NH_3$, $NF_3$, $B_2H_6$, alkyl silane, an alkane silane, an alkene silane, an alkyne silane, and $C_xH_y$, where $x \geq 1$, and $y \geq 4$, and combinations of two or more thereof. The first and optional second gas mixtures are formed by the first and optional second gas supplies of the GCIB processing system.

When depositing silicon, a substrate may be irradiated by a GCIB formed from a first or optional second gas mixture having a silicon-containing gas. For example, a gas mixture may comprise silane ($SiH_4$). In another example, the gas mixture may comprise disilane ($Si_2H_6$), dichlorosilane ($SiH_2Cl_2$), trichlorosilane ($SiCl_3H$), diethylsilane ($C_4H_{12}Si$), trimethylsilane ($C_3H_{10}Si$), silicon tetrachloride ($SiCl_4$), silicon tetrafluoride ($SiF_4$), or a combination of two or more thereof.

When depositing or growing an oxide such as $SiO_x$, a substrate may be irradiated by a GCIB formed from a first and optional second gas mixture having a silicon-containing gas and an oxygen-containing gas, respectively. For example, the first gas mixture may comprise silane ($SiH_4$), and the second gas mixture may comprise $O_2$. In another example, the second gas mixture may comprise $O_2$, CO, $CO_2$, NO, $NO_2$, or $N_2O$, or any combination of two or more thereof.

When depositing or growing a nitride such as $SiN_x$, a substrate may be irradiated by a GCIB formed from a first and optional second gas mixture having a silicon-containing gas and a nitrogen-containing gas, respectively. For example, the first gas mixture may comprise silane ($SiH_4$), and the second gas mixture may comprise $N_2$. In another example, the second gas mixture may comprise $N_2$, NO, $NO_2$, $N_2O$, or $NH_3$, or any combination of two or more thereof.

When depositing a carbide such as $SiC_x$, a substrate may be irradiated by a GCIB formed from a pressurized gas mixture having a silicon-containing gas and a carbon-containing gas. For example, the first gas mixture may comprise silane ($SiH_4$) and $CH_4$. Alternatively, the first gas mixture may comprise silane ($SiH_4$) only, and the optional second gas mixture may comprise $CH_4$. Additionally, for example, the first gas mixture may comprise silane ($SiH_4$), and the optional second gas mixture may comprise methylsilane ($H_3C$—$SiH_3$). Furthermore, for example, the first gas mixture may comprise a silicon-containing gas and $CH_4$ (or more generally a hydrocarbon gas, i.e., $C_xH_y$), and the optional second gas mixture may comprise CO, or $CO_2$. Further yet, any of the first gas mixture and optional second gas mixture may comprise, for example, alkyl silane, an alkane silane, an alkene silane, or an alkyne silane, or any combination of two or more thereof. Additionally, for example, the first gas mixture may comprise silane, methylsilane ($H_3C$—$SiH_3$), dimethylsilane ($H_3C$—$SiH_2$—$CH_3$), trimethylsilane (($CH_3$)$_3$—SiH), or tetramethylsilane (($CH_3$)$_4$—Si), or any combination of two or more thereof. When growing or depositing a carbonitride such as $SiC_xN_y$, the optional second gas mixture may further comprise a nitrogen-containing gas. For example, the nitrogen-containing gas may include $N_2$, $NH_3$, $NF_3$, NO, $N_2O$, or $NO_2$, or a combination of two or more thereof. The addition of a nitrogen-containing gas may permit forming a silicon carbonitride film (SiCN).

When growing or depositing a nitride such as $BN_x$, a substrate may be irradiated by a GCIB formed from a first gas mixture having a boron-containing gas and an optional second gas mixture having a nitrogen-containing gas. For example, the first gas mixture may comprise diborane ($B_2H_6$), and the optional second gas mixture may comprise $N_2$. In another example, the optional second gas mixture may comprise $N_2$, NO, $NO_2$, $N_2O$, or $NH_3$, or any combination of two or more thereof.

When growing or depositing a nitride such as $BSi_xN_y$, a substrate may be irradiated by a GCIB formed from a first gas mixture having a silicon-containing gas, and a optional second gas mixture having a boron-containing gas and a nitrogen-containing gas. For example, the first gas mixture may comprise silane ($SiH_4$), and the optional second gas mixture may comprise diborane ($B_2H_6$) and $N_2$. In another example, the optional second gas mixture may comprise $B_2H_6$, $N_2$, NO, $NO_2$, $N_2O$, or $NH_3$, or any combination of two or more thereof.

In other processes, such as for example, infusion, doping, and layer surface modification, in addition to layer growth and deposition, further additional gases may be used to form gas mixtures in gas supplies of a GCIB processing system. These gases include germanium-, phosphorus-, and arsenic-containing gases, such as $GeH_4$, $Ge_2H_6$, $GeH_2Cl_2$, $GeCl_3H$, methylgermane, dimethylgermane, trimethylgermane, tetramethylgermane, ethylgermane, diethylgermane, triethylgermane, tetraethylgermane, $GeCl_4$, $GeF_4$, $BF_3$, $AsH_3$, $AsF_5$, $PH_3$, $PF_3$, $PCl_5$, or $PF_5$, or any combination of two or more thereof.

In any one of the above examples, the first and/or second gas mixture may comprise an optional inert dilution gas. The dilution gas may comprise a noble gas, such as for example, He, Ne, Ar, Kr, Xe, or Rn, which may be different for the first and second gas mixtures.

Further extending the above process, optional third, fourth, etc., gas mixtures may be introduced (not shown), as the process may require, and if the number of available gas supplies and nozzles installed in the GCIB system, permits.

The inventors have tested the multiple nozzle GCIB system in a $SiO_2$ deposition process, which may be utilized for blanket $SiO_2$ deposition, or trench filling, such as shallow trench isolation (STI) structure filling. A similar process may be employed also for growth of a $SiO_2$ film. The hardware comprised a dual nozzle GCIB system configured with a pressure cell chamber, as in FIG. 3, with two gas supplies. The gas supply configuration of the GCIB system was that of FIG. 6. Each gas supply was configured with two gas sources: a first gas source for the process gas, and a second gas source for a dilution gas. The nozzle configuration used was that depicted in FIG. 10A, with nozzles mounted one above the other, and with a gas skimmer of circular cross section. All other components of the GCIB system were that of a single nozzle, single gas supply GCIB system.

To deposit $SiO_2$ on a substrate, the first gas supply was configured to flow $SiH_4$ as a Si-containing gas, which was diluted with He to form a first gas mixture fed into the first nozzle. The total flow rate through the first nozzle was set within the range of 300 to 700 sccm, typically 600 sccm, but the flow rate in a production process may be higher or lower than the above range, e.g. 200 to 1000 sccm. The percentage of $SiH_4$ in He, in the first gas mixture, was typically set at 10%, but in a production process it may be set higher or lower than 10%, e.g. at 2 to 20%. The second gas supply was configured to flow $O_2$ as an O-containing gas, through the second nozzle, at a flow rate ranging from 200 to 500 sccm, and optionally diluted with an additional flow of He ranging from 800 to 1100 sccm, to form a second gas mixture. In an actual production process, the flow rates of $O_2$ and the optional dilution gas may be different. The above flow rate ranges for the two gas mixtures translate into an $O_2/SiH_4$ ratio ranging from 3.3 to 16.7, which in part determines the $SiO_2$ film stoichiometry.

Deposition processes were run with the above two gas mixtures, with acceleration potentials $V_{Acc}$ ranging from 10 to 50 kV. The gas flow rate into the pressure cell chamber was either zero (i.e. off), or set at 20 sccm ("20P"), which translates into a pressure-distance integral of about 0.003 Torr-cm. The GCIB beam current under these conditions ranged from 15 to 49 μA.

Deposited $SiO_2$ films ranged in color from brown to very slightly tinted or colorless, with increasing $O_2/SiH_4$ ratio. All films showed evidence of compressive stress in acquired FTIR spectra, which is a common feature of most as-deposited GCIB films. The compressive stress can be reduced or eliminated using a post-deposition anneal process, at a temperature ranging from 600 to 1000 degrees C., and of 15 to 60 min duration, for example. The anneal process also causes the film roughness $R_a$ to decrease from as-deposited values of 6.9 Å to 7.4 Å, which depend weakly on the GCIB process condition, by about 0.3 Å $R_a$. Gap fill experiments were also conducted, in which trenches were successfully filled with $SiO_2$ before trench pinch-off.

Figure 15:
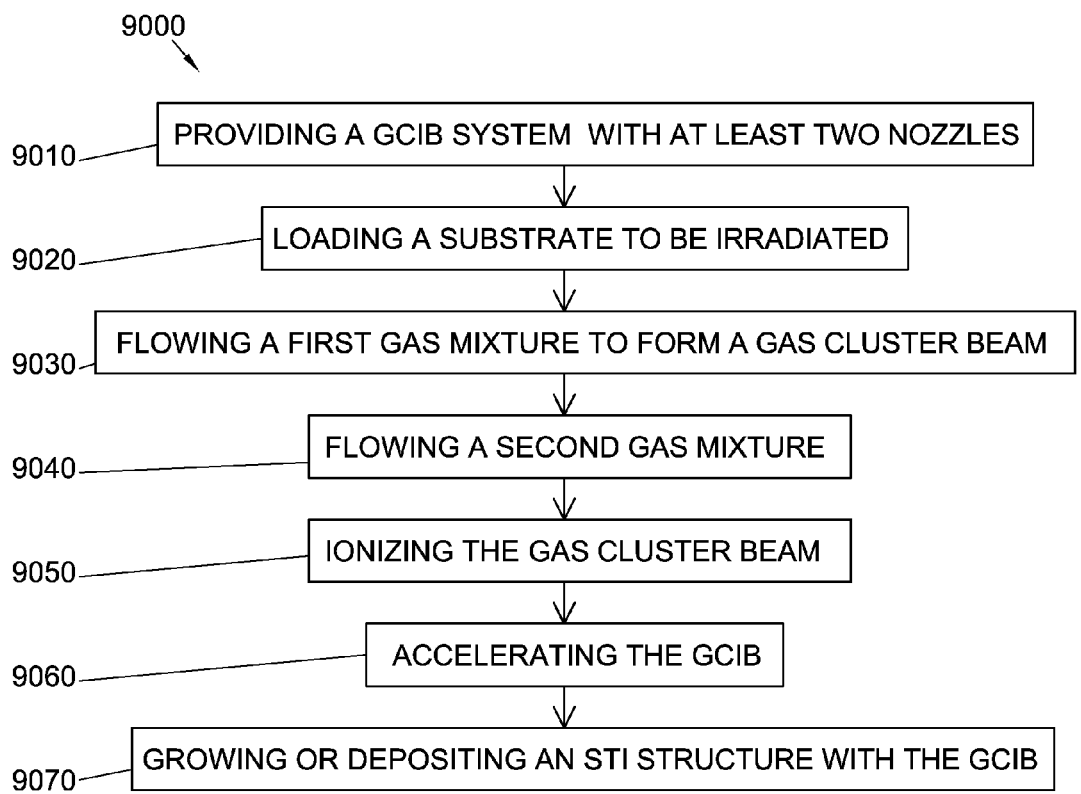
FIG. 15 is a flowchart of an embodiment of a method for formation of a shallow trench isolation (STI) structure using a GCIB system with multiple nozzles.

The flowchart in FIG. 15 shows the steps of a process 9000 of formation of a shallow trench isolation (STI) structure using a GCIB system with multiple nozzle and gas supplies.

The process of forming an STI using a conventional single nozzle GCIB processing system is discussed in U.S. Provisional Patent Application No. 61/149,917, entitled "METHOD FOR FORMING TRENCH ISOLATION USING GAS CLUSTER ION BEAM PROCESSING" (Ref. No. EP-169 PROV), the entire content of which is herein incorporated by reference in its entirety.

The method begins with step 9010, with providing a GCIB processing system with a set of at least two nozzles either arranged in mutual close proximity to ensure coalescence of individual gas cluster beams before reaching a single gas skimmer or arranged so as to have intersecting beam axes, a first gas supply configured to supply a subset of the full set of nozzles (e.g. a single nozzle, or multiple nozzles of the subset) with a gas mixture, and a second gas supply to supply the remaining nozzles (i.e. nozzles not supplied by the first gas supply). The GCIB processing system can be any of the GCIB processing systems (100, 100' or 100") described above in FIG. 1, 2 or 3, with any arrangement of nozzles and gas supplies shown in FIGS. 5-13D.

In step 9020, a substrate is loaded into the GCIB processing system. The substrate can include a conductive material, a non-conductive material, or a semi-conductive material, or a combination of two or more materials thereof. Additionally, the substrate may include one or more material structures formed thereon, or the substrate may be a blanket substrate free of material structures. The substrate can be positioned in the GCIB processing system on a substrate holder and may be securely held by the substrate holder. The temperature of the substrate may or may not be controlled. For example, the substrate may be heated or cooled during a film forming process. The environment surrounding the substrate is maintained at a reduced pressure.

In step 9030, a flow of a first gas mixture is started from the first gas supply. The flow of gas through the nozzle or subset of nozzles connected to the first gas supply forms a gas cluster beam which passes through the single gas skimmer into the ionization chamber of the GCIB processing system.

In step 9040, a second gas mixture is introduced from the second gas supply into all or a subset of the remaining nozzles (i.e. nozzles not supplied by the first gas supply) to form a gas cluster beam or beams that coalesces and/or intersects with the beam or beams from the first nozzle or subset of nozzles to form a single gas cluster beam.

In step 9050, the single gas cluster beam is ionized in an ionizer, such as, for example, ionizer 300 of FIG. 4, to form a gas cluster ion beam (GCIB). In step 9060, the GCIB is accelerated by applying a beam acceleration potential to the GCIB.

In step 9070, the GCIB composed of the first gas mixture and the second gas mixture is used to irradiate the substrate loaded in the GCIB processing system, to form an STI structure on the substrate, or on a layer atop the substrate. The STI structure can be used, for example, in a memory device.

To form an $SiO_2$ STI structure, i.e. to fill the STI trench with $SiO_2$, the first gas mixture may comprise a silicon-containing gas. For example, the first gas mixture may comprise $SiH_4$, $Si_2H_6$, $C_4H_{12}Si$, $C_3H_{10}Si$, $H_3C-SiH_3$, $H_3C-SiH_2-CH_3$, $(CH_3)_3-SiH$, $(CH_3)_4-Si$, $SiH_2Cl_2$, $SiCl_3H$, $SiCl_4$, $SiF_4$, alkyl silane, an alkane silane, an alkene silane, an alkyne silane, or any combination of two or more thereof. Optionally, the first gas mixture may further comprise an inert dilution gas. The dilution gas may comprise a noble gas, such as for example, He, Ne, Ar, Kr, Xe, or Rn. To form the STI structure, the second gas mixture may comprise an oxygen-containing gas. For example, the second gas mixture may comprise $O_2$, CO, $CO_2$, NO, $NO_2$, $N_2O$, or any combination of two or more thereof. Optionally, the second gas mixture may further comprise an inert dilution gas. The dilution gas may comprise a noble gas, such as for example, He, Ne, Ar, Kr, Xe, or Rn, or any combination of two or more thereof.

Figure 16:
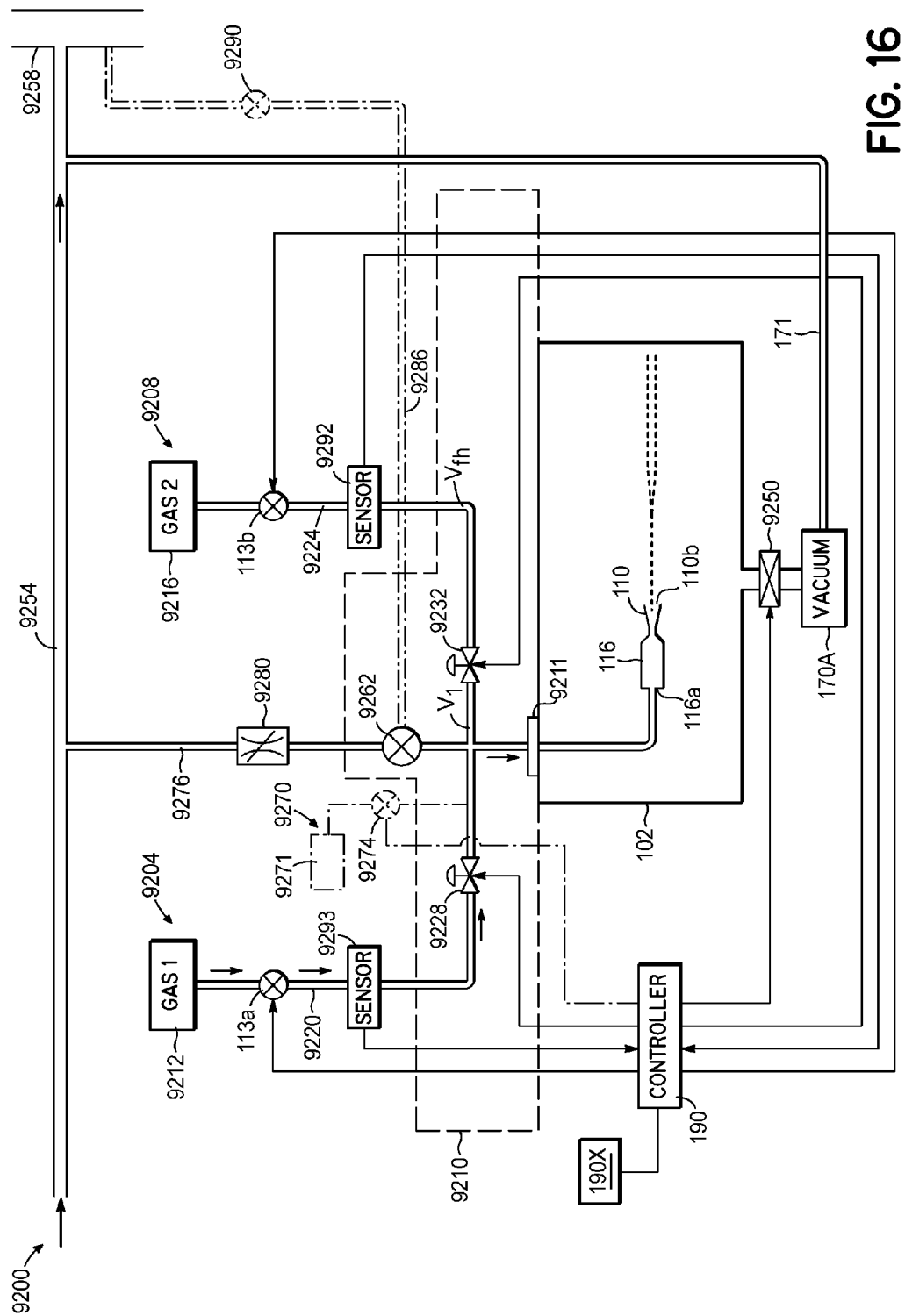
FIG. 16 is a schematic representation of an embodiment of a system for supplying gas to a single nozzle GCIB system.
Figure 17:
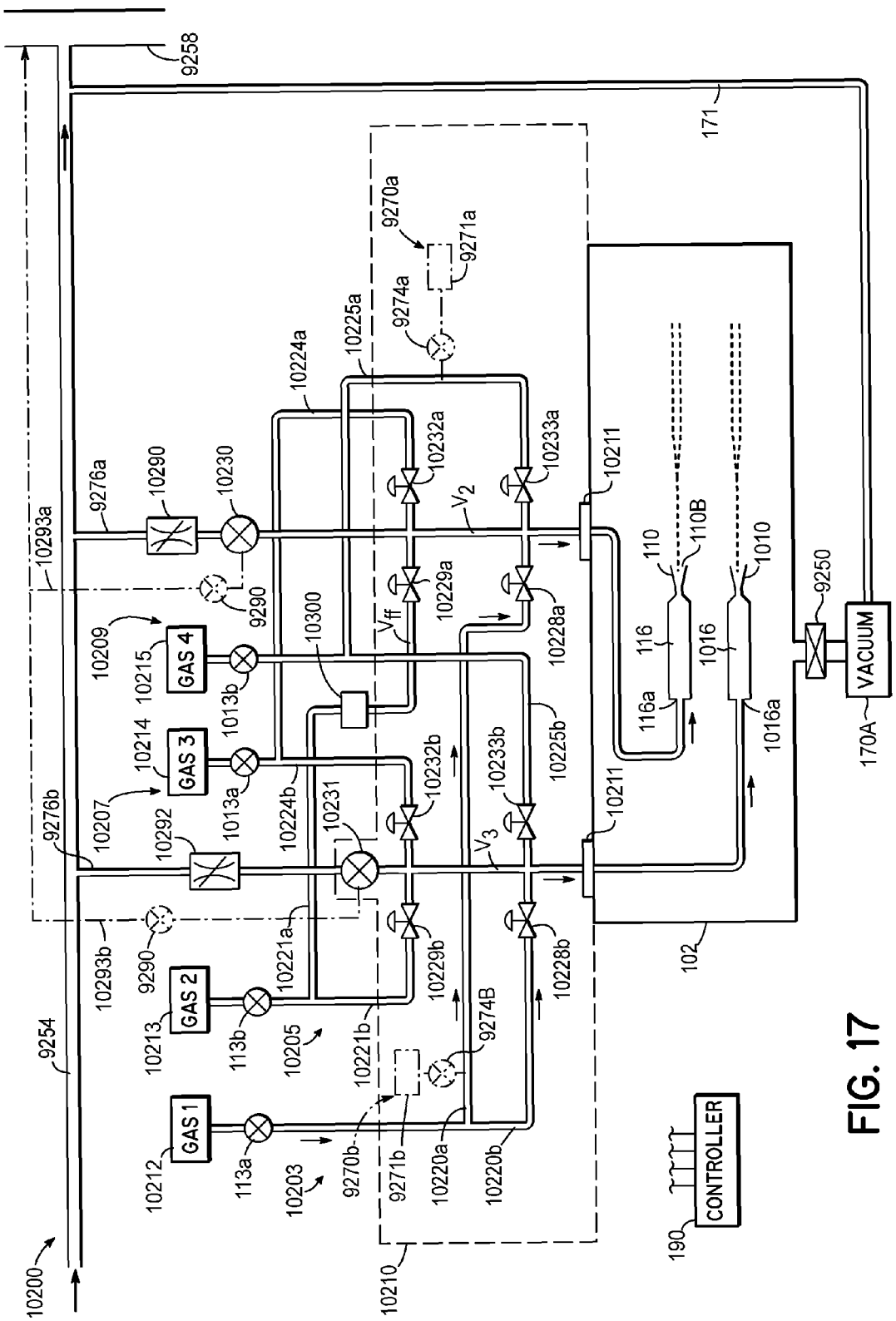
FIG. 17 is a schematic representation of an embodiment of a system for supplying gas to a dual nozzle GCIB system.

FIGS. 16-17 schematically illustrate different embodiments of systems or arrangements for supplying at least two gases from respective gas supplies to one or more nozzles of the GICB system. Like reference numerals in each of those figures refer to similar features in the preceding figures, the description of which may be referred to for an understanding of the features of FIGS. 16-17, as well. Notably, the arrangements illustrated in FIGS. 16-17 permit rapidly changing the supply of gases between different gas supplies to the one or more nozzles, as explained more fully below.

With particular reference to FIG. 16, a first embodiment of a rapid gas switching system or arrangement, generally identified with the numeral 9200, includes first and second gas supplies 9204, 9208 located with an enclosure 9210 that is coupled to the vacuum vessel 102 through one or more flanges 9211. The gas supplies 9204, 9208 respectively supply first and second gases to a nozzle 110 from respective first and second gas sources 9212, 9216. The gas sources 9212, 9216 fluidly communicate with an inlet 116a of a stagnation chamber 116 that is upstream of and adjacent the nozzle 110. Each of the gas supplies 9204, 9208 includes, in this embodiment, a primary feed valve 113a, 113b that is operatively coupled to the controller 190, so that the controller 190 may control actuation of the primary feed valves 113a, 113b to thereby permit selective flow of the first and second gases from the gas sources 9212, 9216, downstream, toward the nozzle 110. The first and second gases flow through respective conduits or lines 9220, 9224 between the primary feed valves 113a, 113b and a pair of isolation valves 9228, 9232, also operatively coupled to the controller 190, and which control the selective flow of the first and second gases from lines 9220, 9224 toward the nozzle 110.

The position of the isolation valves 9228, 9232 is chosen to minimize the available volume for holding gas between the valves 9228, 9232 and the inlet 116a of the stagnation chamber 116. In addition, the isolation valves 9228, 9232 and the inlet 116a jointly define a common gas-holding volume $V_1$ that is less than about 2 $cm^3$ and in some embodiments less than about 0.5 $cm^3$. This small volume results from suitably chosen combinations of length and inner diameter of each of the conduits defining such volume. For example, and without limitation, the conduits defining such volume may include pipes having an inner diameter of about 1/16 of an inch (1.5875 mm). Minimization of the common gas-holding volume $V_1$ facilitates the rapid switching of the supply of gas to nozzle 110 between the first and second gas sources 9212, 9216. More specifically, evacuation of one of the gases being supplied to the nozzle 110 at any given time includes evacuation of the volume of gas held in the stagnation chamber 116 and evacuation of the gas held in the common gas-holding volume $V_1$. Since the volume defined by the stagnation chamber 116 is predetermined, thus requiring a more or less predetermined length of time to evacuate, minimization of the common gas-holding volume $V_1$ immediately upstream of the stagnation chamber 116 facilitates minimizing the total time required for evacuation of the gas, before supply of another gas to the nozzle 110 may begin.

In certain embodiments, the system 9200 may be configured to substantially evacuate the stagnation chamber 116 and the common gas-holding volume $V_1$ in a period of time less than about 10 seconds. More specifically, in certain embodiments, the system 9200 may be configured to substantially evacuate the stagnation chamber 116 and the common gas-holding volume $V_1$ in a period of time less than about 5 seconds. As used herein, the term "substantial" and derivatives thereof, when referring to the level of evacuation of a gas from the stagnation chamber 116 and from the common gas-holding volume $V_1$, refer to an extent of evacuation sufficient to prevent issues arising from lack of compatibility between the gas being evacuated and the gas with which the evacuated gas is being replaced. In a non-limiting example, the level of "substantial" evacuation may be less than 100%, for example at least about 90% or at least about 95%. In another non-limiting example, such level may be about 100%. While not shown in FIG. 16, system 9200 may include a residual gas analyzer operatively coupled to the controller 190 for analyzing and/or displaying the partial pressure of the gas being evacuated, for example in the common gas-holding volume $V_1$. In this regard, the controller 190 may begin supply of the second gas to nozzle 110 only after the partial pressure in common gas-holding volume $V_1$ reaches a predetermined level. An exemplary residual gas analyzer is disclosed in U.S. patent application Ser. No. 11/950,128, the entire contents of which are hereby expressly incorporated by reference herein in their entirety.

With continued reference to FIG. 16, an operation is therefore contemplated in which supply of a first gas to the nozzle 110 is interrupted and replaced with supply of a second gas to the nozzle 110. For example, the first gas may be supplied from the first gas source 9212, through the first primary valve 113a being in an open condition so as to allow flow, through conduit 9220, and through the first isolation valve 9228. From the first isolation valve 9228, the first gas flows through the inlet 116a into the stagnation chamber 116, into nozzle 110, and out through an outlet 110b in the form a gas cluster beam, as explained above. Flow of the first gas fills up the common gas-holding volume $V_1$, including the portion of conduit immediately downstream of the second isolation valve 9232, by virtue of the fluid communication between the first and second isolation valves 9228, 9232 downstream of those valves 9228, 9232.

When the user wishes to switch the supply of gas from the first gas source 9212 to the second gas source 9216, the controller 190 generates a signal directing the first primary feed valve 113a to close, thereby interrupting flow of the first gas through the first conduit 9220, and also generates a signal effective to close the first isolation valve 9228, thereby interrupting the flow of the first gas from conduit 9220 into the common gas-holding volume $V_1$. The first gas is then evacuated from the stagnation chamber 116 and from the common gas-holding volume $V_1$, as will be described more fully below.

In one embodiment, evacuation includes actuating (e.g., opening) a first evacuation valve 9250, located adjacent to or downstream of the nozzle 110, and associated with the vacuum pumping system 170A fluidly coupled to the vacuum vessel 102. In embodiments in which the evacuation valve 9250 is permanently open, "actuation" of the valve 9250 may entail adjusting (e.g., increasing) the operational speed of the vacuum pumping system 170A so as to increase the flow of gases through vacuum pumping system 170A and adjusting the internal components of valve 9250 to accommodate the higher flow rate of gases. Actuation of the first evacuation valve 9250, in turn, results in the first gas being drawn by the vacuum pumping system 170A and forced to flow downstream from the common gas-holding volume $V_1$ and from the stagnation chamber 116 sequentially in a downstream direction through the outlet 110b of the nozzle 110, through the first evacuation valve 9250, and into the vacuum pumping system 170A. From there, the first gas continues to flow downstream in a vacuum line 171 associated with the vacuum pumping system 170A, and sequentially into a roughing line 9254 and then into an exhaust line 9258. The exhaust line 9258 is a line that vents the remnants of all processing carried out by the GCIB system out of the building or facility housing that system.

In another embodiment, evacuation may be carried out through an optional second evacuation valve 9262 that is located upstream of the nozzle 110. The second evacuation valve 9262 of the illustrated embodiment is in fluid communication with the isolation valves 9228, 9232, and jointly defines, along with those isolation valves and with inlet 116a of stagnation chamber 116, the common gas-holding volume $V_1$. The location of second evacuation valve 9262, accordingly, is also chosen so as to minimize the gas-holding volume $V_1$. In operation, the controller 190 actuates (e.g., opens) the second evacuation valve 9262 while maintaining the first and second isolation valves 9228, 9232 in a closed position, such that the first gas may flow upstream from the stagnation chamber 116 (i.e., through inlet 116a) and from the common gas-holding volume $V_1$. To this end, an optional purging gas may be supplied into the upstream flow path of the first gas toward the second evacuation valve 9262, to flush the remnants of the first gas. More specifically, the purging gas may be supplied to the common gas-holding volume $V_1$ from an optional dedicated cleaning gas supply 9270 that includes a dedicated gas source 9271, and which is different from the first and second gas supplies 9204, 9208. The dedicated cleaning gas supply 9270 is in fluid communication with the common gas-holding volume $V_1$ through a purging gas valve 9274.

In that embodiment, actuation by the controller 190 of the purging gas valve 9274 results in the purging gas flowing into the common gas-holding volume $V_1$ and pushing the remnants of the first gas upstream through the second evacuation valve 9262. In yet another specific embodiment, the purging gas is supplied from the second gas source 9216. In this other embodiment, the second isolation valve 9232 is actuated (e.g., opened) such that the purging gas flows from the second gas source 9216, through the second conduit 9224, and into the common gas-holding volume $V_1$, thereby pushing the remnants of the first gas through the second evacuation valve 9262.

With continued reference to FIG. 16, the second evacuation valve 9262 allows the flow of the first gas being evacuated through an evacuation line 9276 that is fluidly coupled to the same roughing line 9254 to which the vacuum line 171 is connected. In this regard, it may be desirable to control the pressure of the first gas (and/or purging gas) being evacuated through the second evacuation valve 9262 and flowing into the roughing line 9254, so as to prevent the excessive build-up of back pressure in the vacuum pumping system 170A. To this end, the system 9200 may include a restrictor 9280 in evacuation line 9276 that controls (i.e., minimizes) the pressure of the first gas (and/or purging gas) flowing upstream into the roughing line 9254. The restrictor 9280, which is schematically depicted, may take one of several forms. For example, and without limitation, the restrictor 9280 may take the form of throttle or a venturi valve in line 9276. Alternatively, the restrictor 9280 may take the form of a fixed, small orifice in the roughing line 9254, with the size of the orifice being chosen so as to permit the flow of the first gas (and/or purging gas) into the roughing line 9254 without exceeding a predetermined pressure.

Alternatively, the second evacuation valve 9262 may be coupled instead to an optional evacuation line 9286 that is directly connected to the exhaust line 9258. An auxiliary valve such as an on-off valve or a venturi valve 9290 may be provided in evacuation line 9286. The venturi valve 9290 controls the pressure of the first gas (and/or purging gas) flowing upstream directly into the exhaust line 9258. Accordingly, the venturi valve 9290 prevents the excessive build-up of back pressure in the vacuum pumping system 170A or in any other pumping system (not shown) directing the downstream flow of gas from the roughing line 9254 to the exhaust line 9258.

A contemplated modification of the specific embodiments discussed above includes using the purging gas to flush the common gas-holding volume $V_1$ and the stagnation chamber 116 through the outlet 110b of nozzle 110, rather than through the second evacuation valve 9262. More specifically, the purging gas may be directed by the controller 190 to flow from either the second gas source 9216 or from the optional purging gas supply 9270 in a downstream direction, so as to push the remnants of the first gas through the outlet 110b. To this end, the controller 190 actuates (e.g., opens) the first evacuation valve 9250 such that the remnants of the first gas and the purging gas are drawn by the vacuum pumping system 170A, and sequentially through the vacuum line 171, roughing line 9254, and then into the exhaust line 9258. While the embodiment of FIG. 16 includes two evacuation valves 9250, 9262, it is contemplated that alternative embodiments may include only one of the evacuation valves 9250, 9262 and still fall within the scope of the present disclosure.

With continued reference to FIG. 16, a contemplated process for switching the supply of gas to the nozzle 110 from the first gas source 9212 to the second gas source 9216 also includes actuating (e.g., opening) the second isolation valve 9232 to allow the flow of the second gas from the second conduit 9224 so as to fill the common gas-holding volume $V_1$ and flow into the stagnation chamber 116 and into nozzle 110. Moreover, the process includes maintaining the second primary feed valve 113b open so as to permit the flow of the second gas from the second gas source 9216 toward the nozzle 110. In the illustrated embodiment, a pressurized feed holding volume $V_{fh}$ is defined in conduit 9224 between the second primary valve 113b and the second isolation valve 9232. Prior to switching the supply of gas to nozzle 110 from the first supply 9204 to the second supply 9208, and during supply of the first gas from the first gas source 9212 to nozzle 110, the second isolation valve 9232 and the second primary valve 113b are maintained in a closed position, and the second gas in the feed holding volume $V_{fh}$ is pressurized to a predetermined level. This pressurization of the second gas permits the second gas to flow rapidly into the common gas-holding volume $V_1$, stagnation chamber 116, and toward the nozzle 110, upon actuation (e.g., opening) of the second isolation valve 9232.

To this end, the controller 190 controls actuation of the second isolation valve 9232 and of the second primary valve 113b, so as to permit pressurization of the second gas in the feed holding volume $V_{fh}$. For example, the controller 190 may maintain the second primary valve 113b open during a predetermined length of time while maintaining the second isolation valve 9232 closed, such that continued supply of the second gas into the feed holding volume $V_{fh}$ results in pressurization of the second gas until a predetermined pressure is reached. The predetermined pressure may, for example, be automatically obtained by the controller 190. More specifically, the controller 190 may have a user interface 190X that allows a user to select a desired flow rate of the second gas to be supplied to the nozzle 110 during GCIB processing. Once the controller 190 receives this desired flow rate, the controller 190 may automatically identify a predetermined pressure required in the feed holding volume $V_{fh}$ to permit rapid deployment of the second gas. In this regard, the controller 190 may, for example, automatically calculate such required pressure, or may instead match the received desired flow rate value to a predetermined list of pressure values corresponding to various desired flow rate values. In an alternative embodiment, the controller 190 may instead receive from the user a desired pressure of the second gas in the feed holding volume $V_{fh}$, and the controller 190 is configured to automatically determine (e.g., calculate, look up from a list) the required flow of the second gas in order to maintain the desired pressure in the feed holding volume $V_{fh}$.

A pressure sensor 9292 is provided in conduit 9224 and is operatively coupled to the controller 190 to facilitate pressurization of the second gas in the feed holding volume $V_{fh}$. More specifically, the sensor 9292 senses the pressure of the second gas in the feed holding volume $V_{fh}$ of conduit 9224 and is configured to generate a signal to the controller 190 that is associated with the sensed pressure. In response to this signal, the controller 190 selectively actuates one or both of the second primary valve 113b or the second isolation valve 9232, as explained above, until the automatically identified pressure of the second gas in the feed holding volume $V_{fh}$ is reached. A second sensor 9293 is located in line 9220 of the first gas supply 9204 and is similar in function to the sensor 9292 associated with the line 9224 of the second gas supply 9208.

Referring now to FIG. 17, one or more of the various features described above with respect to the embodiment of FIG. 16 are similarly applicable to a system or arrangement having more than one nozzle, such as, and without limitation, two nozzles. For ease of understanding, like reference numerals in FIG. 17 refer to similar features in FIG. 16, the description of which may be referred to for an understanding of the features of FIG. 17 as well. The exemplary arrangement of FIG. 17, generally identified with the numeral 10200, includes four gas supplies 10203, 10205, 10207, 10209, located within an enclosure 10210 coupled to the vacuum vessel 102 through a pair of flanges 10211. The supplies 10203, 10205, 10207, and 10209 respectively supply four gases to a pair of nozzles 110, 1010 from four respective gas sources 10212, 10213, 10214, 10215. Each of the gases supplied from gas sources 10212, 10213, 10214, 10215 may be a pure gas or may instead be a mixture of two or more pure gases.

Each of the gas sources 10212, 10213, 10214, 10215 fluidly communicates with respective inlets 116a, 1016a of a pair of stagnation chambers 116, 1016 that are located upstream of and adjacent the nozzles 110, 1010. Each of the gas supplies 10203, 10205, 10207, 10209 includes, in this embodiment, a primary feed valve 113a, 113b, 1013a, 1013b that is operatively coupled to the controller 190 that controls actuation of the primary feed valves 113a, 113b, 1013a, 1013b to thereby permit selective flow of the first, second, third, and fourth gases from the gas sources 10212, 10213, 10214, 10215 downstream toward the nozzles 110, 1010. The four gases flow through respective pairs of conduits or lines 10220a,b, 10221a,b, 10224a,b, and 10225a,b between the primary feed valves 113a, 113b, 1013a, 1013b and a plurality of isolation valves 10228a,b, 10229a,b, 10232a,b, and 10233a,b. These isolation valves are also operatively coupled to the controller 190, and control selective flow of the first, second, third and fourth gases from conduits or lines 10220a, 10220b, 10221a, 10221b, 10224a, 10224b, 10225a, 10225b toward the nozzles 110, 1010. More specifically, the isolation valves 10228a, 10228b form part of the first gas supply 10203; the isolation valves 10229a, 10229b form part of the second gas supply 10205; the isolation valves 10232a, 10232b form part of the third gas supply 10207; and the isolation valves 10233a, 10233b form part of the fourth gas supply 10209.

The position of the isolation valves 10228a, 10228b 10229a, 10229b 10232a, 10232b, 10233a, 10233b is chosen so as to minimize the available volume for holding gas between the isolation valves 10228a, 10228b, 10229a, 10229b, 10232a, 10232b, 10233a, 10233b and the inlets 116a, 1016a of the stagnation chambers 116, 1016. In addition, the isolation valves 10228a, 10229a, 10232a, 10233a respectively associated with each of the four gas supplies 10203, 10205, 10207, 10209, and the inlet 116a, jointly define a first common gas-holding volume $V_2$ that is less than about 2 cm$^3$, for example less than 0.5 cm$^3$. Similarly, the isolation valves 10228b, 10229b, 10232b, 10233b, which are also respectively associated with each of the four gas supplies 10203, 10205, 10207, 10209, jointly define, along with inlet 1016a of the second stagnation chamber 1016, a second common gas-holding volume $V_3$. The second common gas-holding volume $V_3$ is less than about 2 cm$^3$, and in some embodiments, less than about 0.5 cm$^3$. Those relatively small volumes $V_2$, $V_3$ result from suitably chosen combinations of length and inner diameter of each of the conduits defining such volumes. For example, and without limitation, the conduits defining those volumes may include pipes having an inner diameter of about 1/16 of an inch (1.5875 mm).

With continued reference to FIG. 17, minimization of the common gas-holding volumes $V_2$, $V_3$ facilitates the rapid switch of the supply of gas to the nozzles 110, 1010, between the first, second, third, and fourth gas sources 10212, 10213, 10214, 10215. For example, evacuation of one of the gases being supplied to the nozzle 110 includes evacuation of the volume of gas held in the stagnation chamber 116 and evacuation of the gas held in the first common gas-holding volume $V_2$. Since the volume defined by the stagnation chamber 116 is predetermined, thus requiring a more or less predetermined length of time to evacuate, minimization of the first common gas-holding volume $V_2$ immediately upstream of the stagnation chamber 116 facilitates minimizing the total time required for evacuation of the gas, before supply of another gas to the nozzle 110 may begin.

In certain embodiments, the system may be configured to substantially evacuate the stagnation chamber 116 and the first common gas-holding volume $V_2$ or substantially evacuate the stagnation chamber 1016 and the second common gas-holding volume $V_3$, in a period of time less than about 10 seconds. More specifically, in certain embodiments, the system may be configured to substantially evacuate either stagnation chamber 116, 1016 and the first common gas-holding volume $V_2$ or the second common gas-holding volume $V_3$ in a period of time less than about 5 seconds. As used herein, the term "substantial" and derivatives thereof, when referring to the level of evacuation of a gas from the stagnation chambers 116, 1016 and from the common gas-holding volumes $V_2$, $V_3$ refer to a level evacuation sufficient to prevent issues arising from lack of compatibility between the gas being evacuated and the gas with which the evacuated gas is being replaced. In a non-limiting example, such level of "substantial" evacuation may be less than 100%, for example at least about 90% or at least about 95%. In another non-limiting example, such level of evacuation may be about 100%.

Evacuation of gas from either of the common gas-holding volumes $V_2$, $V_3$ is effected through one or more evacuation valves 10230, 10231, located upstream of the nozzles 110, 1010, or through the evacuation valve 9250 located adjacent to or downstream of the nozzles 110, 1010 and in fluid communication with the interior of vacuum vessel 102. The evacuation valves 10230, 10231 are similar in structure and function to the first evacuation valve 9262 of the embodiment of FIG. 16, and the evacuation valve 9250 is as described in the embodiment of FIG. 16. The evacuation valve 10230 in this exemplary embodiment is in fluid communication with the isolation valves 10228a, 10229a, 10232a, 10233a, and jointly defines, along with inlet 116a of the first stagnation chamber 116, and with those isolation valves, the first common gas-holding volume $V_2$. And the evacuation valve 10231 in this exemplary embodiment is in fluid communication with the isolation valves 10228b, 10229b, 10232b, 10233b. The evacuation valve 10231 jointly defines with these isolation valves and with the inlet 1016a of the second stagnation chamber 1016, the second common gas-holding volume $V_3$. The locations of these evacuation valves 10230, 10231, accordingly, are chosen so as to minimize the first and second common gas-holding volumes $V_2$, $V_3$. The evacuation valves 10230, 10231 are located in respective evacuation lines 9276a, 9276b that are fluidly coupled to the roughing line 9254.

The system 10200 also includes a pair of restrictors 10290, 10292 in the evacuation lines 9276a, 9276b, respectively, and which are similar in structure and function to the restrictor 9280 of the embodiment of FIG. 16. One or more optional evacuation lines 10293a, 10293b may be fluidly coupled to the evacuation valves 10230, 10231 and directly connected to the exhaust line 9258. Moreover, a venturi valve 9290 may be provided in one or both of the optional evacuation lines 10293a, 10293b to control the pressure of the gas flowing upstream directly into the exhaust line 9258. The venturi valve 9290 prevents the excessive build-up of back pressure in the vacuum pumping system 170A or in any other pumping system (not shown) directing the downstream flow of gas from the roughing line 9254 to the exhaust line 9258. System 10200 may further include one or more dedicated supplies 9270a, 9270b of cleaning (or purging) gas different from the first, second, third, and fourth gas supplies 10203, 10205, 10207, 10209 and similar in structure and function to the dedicated cleaning gas supply 9270 of the embodiment of FIG. 16. The one or more dedicated gas supplies 9270a, 9270b have respective gas sources 9271a, 9271b. In the embodiment of FIG. 17, respective cleaning gas valves 9274a, 9274b control the flow of cleaning gas from the supplies 9270a, 9270b respectively into the first and second common gas-holding volumes $V_2$, $V_3$.

With continued reference to FIG. 17, an exemplary operation is contemplated in which supply of a first gas to either of the nozzles 110, 1010 is interrupted and replaced with supply of a second gas to that nozzle 110, 1010. While the exemplary description of such operation entails switching the supply of gas to one of the nozzles 110, 1010 from a specific one of the gas supplies 10203, 10205, 10207, 10209 to another one of those gas supplies, those of ordinary skill in the art will readily appreciate that the principles and features used in that description may apply to either or both of the nozzles 110, 1010. And those principles and features may also apply to switching the supply of gas to such nozzles 110, 1010 from any of the gas supplies 10203, 10205, 10207, 10209 to any other of the gas supplies 10203, 10205, 10207, 10209. The features and processes described herein may apply to the supply of a purging gas from the optional dedicated gas supply 9270a, 9270b. Moreover, the features and processes described herein are also applicable to the interruption of the simultaneous supply of two or more gases from two or more of the gas supplies 10203, 10205, 10207, 10209 that thereby supply a mixture of gases to the one or more nozzles 110,

1010. More specifically, once flow of the gas mixture is interrupted, another single gas or a mixture of gases from one or more of the other gas supplies 10203, 10205, 10207, 10209 may be supplied to the one or more nozzles 110, 1010.

In a specific example, accordingly, a user may desire to change the supply to nozzle 110 from the first gas supply 10203 to the second gas supply 10205. In that regard, and prior to switching the supply of gas, the first gas flows sequentially from the first gas source 10212, through the first primary valve 113*a* in an open condition, through conduit 10220*a*, and through the isolation valve 10228*a*. From the isolation valve 10228*a*, the first gas flows through the inlet 116*a* into the stagnation chamber 116, into nozzle 110, and out through the outlet 110*b* of nozzle 110 in the form a gas cluster beam, as explained above. Flow of the first gas is effective to fill up the first common gas-holding volume $V_2$.

Switching the supply of gas from the first gas source 10212 to the second gas source 10213 of the first and second gas supplies 10203, 10205, respectively, includes the controller 190 generating a signal directing the first primary feed valve 113*a* to close, thereby interrupting flow of the first gas through the first conduit 10220*a*. The controller 190 also generates a signal to the isolation valve 10228*a*, thereby interrupting the flow of the first gas from conduit 10220*a* into the first common gas-holding volume $V_2$. The first gas is then evacuated from the stagnation chamber 116 and from the first common gas-holding volume $V_2$. In one specific embodiment evacuation includes actuating (e.g., opening, adjusting) the evacuation valve 9250, which is located adjacent to or downstream of the nozzles 110, 1010, and which is associated with the vacuum pumping system 170A, which is fluidly coupled to the vacuum vessel 102.

Actuation of the evacuation valve 9250, in turn, results in the first gas being drawn by the vacuum pumping system 170A and forced to flow downstream from the first common gas-holding volume $V_2$ and from the stagnation chamber 116 sequentially through the outlet 110*b* of the nozzle 110, through the evacuation valve 9250, and into the vacuum pumping system 170A. From there, the first gas continues to flow downstream in a vacuum line 171 associated with the system 170A, and sequentially into a roughing line 9254, and then into the exhaust line 9258.

Alternatively, evacuation of the first gas is carried out through the evacuation valve 10230, which is located upstream of the nozzle 110, as discussed above. In this regard, the controller 190 actuates (e.g., opens) the second evacuation valve 10230 while maintaining the isolation valves 10228*a*, 10229*a* in a closed position, such that the first gas flows upstream from the stagnation chamber 116 (i.e., through inlet 116*a*) and from the first common gas-holding volume $V_2$. The controller 190 also maintains the isolation valves 10232*a*, 10233*a*, respectively associated with the third and fourth gas sources 10214, 10215, in a closed position. The optional purging gas may be supplied into the upstream flow path of the first gas toward the evacuation valve 10230 to flush the remnants of the first gas. More specifically, the purging gas may be supplied to the first common gas-holding volume $V_2$ from the optional dedicated purging gas supply 9270*a* by actuating the optional purging gas valve 9274*a* of that dedicated supply, or from one of the other gas supplies 10207, 10209, by opening the respective isolation valve 10232*a*, 10233*a*. Alternatively, the optional purging gas may be supplied from the second gas supply 10205. Also alternatively, evacuation of the first gas may be carried out by directing the flow of the first gas and/or purging gas in an upstream direction through evacuation valve 10230 and into the optional evacuation line 10293*a*.

With continued reference to FIG. 17, a contemplated exemplary operation also includes pressurizing a feed holding volume $V_{ff}$ in line 10221*a* prior to the starting the supply of the second gas (i.e., from the second gas source 10213) toward the first nozzle 110. The feed holding volume $V_{ff}$ is defined between the primary valve 113*b* and the associated isolation valve 10229*a*, and has respective counterparts (not shown) in each of the lines 10220*a*, 10220*b*, 10221*b*, 10224*a*, 10224*b*, 10225*a*, 10225*b*, with each of those feed holding volumes having a similar function to that of the exemplary feed holding volume $V_{ff}$ as well as to that of the feed holding volume $V_f$ associated with the embodiment of FIG. 16. A pressure sensor 10300 is located in line 10221*a* and also has counterparts (not shown) in each of the lines 10220*a*, 10220*b*, 10221*b*, 10224*a*, 10224*b*, 10225*a*, 10225*b*. The pressure sensor 10300 has a similar function and operative relationship to the controller 190 as the pressure sensors 9292, 9293 of the embodiment of FIG. 16.

While the embodiments of FIGS. 16 and 17 respectively refer to GCIB systems having one and two nozzles, it is contemplated that the various features of those embodiments may be applicable to GCIB systems having any number of nozzles in excess of two, with such other systems still falling within the scope of the present disclosure. In this regard, the embodiments of FIGS. 16 and 17 are intended to be exemplary rather than limiting. Further, reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Various operations may have been described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the figures. It is therefore intended that the scope of the invention be limited not by this detailed description, but rather by the claims appended hereto.

What is claimed is:

1. A processing system for irradiating a substrate with a gas cluster ion beam (GCIB), the system comprising:
    a first nozzle for forming and emitting gas clusters beams through an outlet thereof, and a stagnation chamber upstream of and adjacent the first nozzle and having an inlet, the first nozzle being configured to direct a gas cluster beam toward the substrate;
    an ionizer positioned downstream of the outlet and configured to ionize the gas cluster beam to form the GCIB;
    a first gas supply in fluid communication with the inlet of the stagnation chamber and including a first gas source and a first valve between the first gas source and the first nozzle for controlling flow of a first gas between the first gas source and the first nozzle; and a second gas supply in fluid communication with the inlet of the stagnation chamber and including a second gas source and a second valve between the second gas source and the stagnation chamber for controlling flow of a second gas between the second gas source and the first nozzle, wherein the first and second valves are positioned to define a common gas-holding volume between the first and second valves and the inlet of the stagnation chamber, the common gas-holding volume being less than about 2 $cm^3$ to thereby enable rapid evacuation and switching of gas to the first nozzle between the first gas and the second gas without mixing the first and second gases, and wherein the first and second valves are actuatable to permit selective supply of the first gas from the first gas source or the second gas from the second gas source.

2. The system of claim 1, wherein the common gas-holding volume is less than about 0.5 $cm^3$.

3. The system of claim 1, further comprising:
a vacuum line downstream of the first nozzle and in fluid communication therewith through an evacuation valve, the evacuation valve being configured to evacuate the first or second gas from the common gas-holding volume and from the stagnation chamber through the outlet of the first nozzle.

4. The system of claim 3, further comprising:
a purging gas supply including a source of purging gas in fluid communication with the common gas-holding volume through a purging gas valve, the purging gas valve being selectively actuatable and cooperating with the evacuation valve to flush the common gas-holding volume and the stagnation chamber through the outlet of the first nozzle.

5. The system of claim 3, wherein the second gas supply is configured to supply a purging gas to the common gas-holding volume, the second valve being selectively actuatable and cooperating with the evacuation valve to flush the common gas-holding volume and the stagnation chamber with the purging gas through the outlet of the first nozzle.

6. The system of claim 1, further comprising:
a roughing line in fluid communication with the first nozzle through an evacuation valve located upstream of the first nozzle, the evacuation valve being selectively actuatable to evacuate the first gas from the first nozzle through the inlet of the stagnation chamber.

7. The system of claim 6, further comprising:
a restrictor located between the evacuation valve and the roughing line for controlling the pressure of gas flowing through the inlet of the stagnation chamber into the roughing line.

8. The system of claim 1, further comprising:
a roughing line in fluid communication with the first nozzle through an evacuation valve located upstream of the first nozzle and with the outlet of the first nozzle through a vacuum pump;
an exhaust line downstream of and in fluid communication with the roughing line; and
a venturi valve in the flow path between the evacuation valve and the exhaust line for controlling the pressure of the first or second gas flowing through the inlet of the stagnation chamber into the exhaust line.

9. The system of claim 1, further comprising:
at least one of
a vacuum line downstream of the first nozzle and in fluid communication therewith through a first evacuation valve, the first evacuation valve being configured to evacuate the first or second gas from the stagnation chamber through the outlet of the first nozzle, or
a roughing line in fluid communication with the first nozzle through a second evacuation valve located upstream of the first nozzle, the second evacuation valve being selectively actuatable to evacuate the first or second gas from the stagnation chamber through the inlet thereof,
wherein at least one of the first evacuation valve or the second evacuation valve is configured to substantially evacuate the common gas-holding volume and the stagnation chamber in a period of time less than about 10 seconds.

10. The system of claim 9, wherein the at least one of the first evacuation valve or the second evacuation valve is configured to substantially evacuate the common gas-holding volume and the stagnation chamber in a period of time less than about 5 seconds.

11. The system of claim 1, wherein the first gas supply includes a primary feed valve located between the first gas source and the first valve, the primary feed valve being actuatable and cooperating with the first valve to pressurize a feed holding volume defined between the primary feed valve and the first valve.

12. The system of claim 11, further comprising:
a controller operatively coupled to the primary feed valve; and
a feed sensor operatively coupled to the controller and configured to sense a pressure of gas in the feed holding volume, the sensor being further configured to generate a signal to the controller associated with the sensed pressure and the controller being configured, in response to the signal, to actuate the primary feed valve.

13. The system of claim 12, wherein the controller is operatively coupled to the first valve, the system further comprising:
a user interface operatively coupled to the controller and configured to receive from the user a desired volume of the first gas to be supplied to the first nozzle, the controller being configured, in response to the received desired volume, to actuate at least one of the first valve or the primary feed valve to attain, in the feed holding volume, a predetermined pressure associated with the received desired volume.

14. A processing system for irradiating a substrate with a gas cluster ion beam (GCIB), the system comprising:
a first nozzle for forming and emitting gas clusters beams through an outlet thereof, and a stagnation chamber upstream of and adjacent the first nozzle and having an inlet, the first nozzle being configured to direct a gas cluster beam toward the substrate;
an ionizer positioned downstream of the outlet and configured to ionize the gas cluster beam to form the GCIB;
a first gas supply in fluid communication with the inlet of the stagnation chamber and including a first gas source and a first valve between the first gas source and the first nozzle for controlling flow of a first gas between the first gas source and the first nozzle; and
a second gas supply in fluid communication with the inlet of the stagnation chamber and including a second gas source and a second valve between the second gas source and the stagnation chamber for controlling flow of a second gas between the second gas source and the first nozzle, a second nozzle for forming and emitting gas clusters beams, the first and second nozzles being arranged in mutually close proximity to one another to at least partially coalesce the gas cluster beams emitted from the first and second nozzles into a single gas cluster beam and to direct the single gas cluster beam toward the substrate, the second nozzle being in fluid communication with the first and second gas supplies to selectively receive the first or second gas therefrom, wherein the first and second valves are positioned to define a common gas-holding volume between the first and second valves and the inlet of the stagnation chamber, the common gas-holding volume being less than about 2 cm$^3$, and wherein the first and second valves are actuatable to permit selective supply of the first gas from the first gas source or the second gas from the second gas source.

15. The system of claim 14, further comprising:
a third gas supply and a fourth gas supply, each in fluid communication with the first and second nozzles to selectively supply respective third and fourth gases thereto, each of the first and second nozzles being configured to selectively emit gas cluster beams from gas received from one or more of the first, second, third or fourth gas supplies.

16. A processing system for irradiating a substrate with a gas cluster ion beam (GCIB), the system comprising:
at least a first nozzle and a second nozzle for forming and emitting gas clusters beams through respective first and second outlets thereof, and first and second stagnation chambers upstream of and adjacent the first and second nozzles respectively and having respective first and second inlets, the first and second nozzles being arranged in mutually close proximity to one another to at least partially coalesce the gas cluster beams emitted from the first and second nozzles into a single gas cluster beam and to direct the single gas cluster beam toward the substrate;

an ionizer positioned downstream of the first and second outlets and configured to ionize the single gas cluster beam to form the GCIB;

a first gas supply in fluid communication with the first and second inlets of the first and second stagnation chambers, the first gas supply including a first gas source and a first pair of valves between the first gas source and each of the first and second nozzles for controlling flow of a first gas between the first gas source and the first and second nozzles, respectively; and a second gas supply in fluid communication with the first and second inlets of the first and second stagnation chambers, the second gas supply including a second gas source and a second pair of valves between the second gas source and each of the first and second nozzles for controlling flow of a second gas between the second gas source and the first and second nozzles, respectively, wherein:

the first and second pairs of valves are positioned so as to define a first common gas-holding volume between one of the valves of the first pair, one of the valves of the second pair, and the first inlet of the first stagnation chamber, and a second common gas-holding volume between the other of the valves of the first pair, the other of the valves of the second pair, and the second inlet of the second stagnation chamber, at least one of the first or second common gas-holding volumes being less than about 2 cm$^3$, and actuation of each of the first and second pairs of valves is effective to permit selective supply of the first or second gases, respectively, from the first or second gas source to the first or second nozzle.

17. The system of claim 16, wherein at least one of the first or second common gas-holding volumes is less than about 0.5 cm$^3$.

18. A method of supplying gas in a processing system used to irradiate a substrate with a gas cluster ion beam (GCIB), the method comprising:
supplying a first gas from a first gas source to a first nozzle through a first valve and through an inlet of a stagnation chamber upstream of and adjacent the first nozzle, the first valve being in fluid communication with a second valve fluidly coupled to a second gas source such that the first valve, the second valve, and the inlet of the stagnation chamber jointly define a common gas-holding volume there between less than about 2 cm$^3$ to thereby enable rapid evacuation and switching of gas to the first nozzle between the first gas and the second gas without mixing the first and second gases, the first nozzle being configured to form and emit a gas cluster beam through an outlet thereof and to direct the gas cluster beam toward the substrate;

directing the gas cluster beam through an ionizer positioned downstream of the outlet to ionize the gas cluster beam and thereby form the GCIB;

closing the first valve to thereby interrupt flow of the first gas from the first gas source to the first nozzle;

evacuating the first gas from the common gas-holding volume and from the stagnation chamber through an evacuation valve; and opening the second valve to supply a second gas from the second gas source to the first nozzle through the common gas-holding volume.

19. The method of claim 18, further comprising:
actuating the evacuation valve to substantially evacuate the first gas from the stagnation chamber and from the common gas-holding volume in a period of time less than about 10 seconds.

20. The method of claim 19, wherein actuation of the evacuation valve is effective to substantially evacuate the first gas from the stagnation chamber and from the common gas-holding volume in a period of time less than about 5 seconds.

21. The method of claim 18, further comprising:
interrupting the supply of the second gas to the first nozzle; and
directing flow of the second gas to a second nozzle for forming and emitting gas cluster beams, the first and second nozzles being arranged in mutually close proximity to one another to at least partially coalesce the gas cluster beams emitted from the first and second nozzles into a single gas cluster beam and to direct the single gas cluster beam toward the substrate.

22. The method of claim 21, further comprising:
selectively supplying a third gas and a fourth gas respectively from third and fourth sources of gas, the first and second nozzles being configured to selectively emit gas cluster beams from gas received from one or more of the first, second, third or fourth sources of gas.

23. The method of claim 18, wherein the second gas is a purging gas selected from the group consisting of $NF_2$, $N_2$, $NF_3$, Ar, $O_2$, $C_3F_8$, $CF_4$, and $C_2F_6$.

24. The method of claim 18, further comprising:
selectively supplying to the first nozzle a purging gas from a purging gas source different from the first and second sources of gas, the purging gas source being in fluid communication with the first nozzle through a purging gas valve cooperating with the evacuation valve to permit the flow of the purging gas and of the first gas or the second gas through the outlet of the first nozzle.

25. The method of claim 18, wherein the second gas source includes a primary feed valve defining a feed holding volume between the primary feed valve and the second valve, the method further comprising:
sensing a pressure of the second gas in the feed holding volume; and
pressurizing the second gas in the feed holding volume in response to the sensing.

26. The method of claim of claim 25, further comprising:
selecting a desired volume of the second gas to be supplied to the first nozzle;
automatically identifying a pressure of the second gas in the feed holding volume corresponding to the selected desired volume; and
automatically pressurizing the second gas in the feed holding volume to the identified pressure.

27. The method of claim 18, wherein:
the evacuation valve is located downstream of the first nozzle, and
the evacuation valve is configured to cause the first gas to be drawn from the stagnation chamber and from the common gas-holding volume through the outlet of the first nozzle.

28. The method of claim 18, wherein:
the evacuation valve is located upstream of the first nozzle, and
the evacuation valve is configured to cause the first gas to flow upstream from the stagnation chamber through the inlet thereof.

29. The method of claim 28, further comprising:
directing flow of the first gas upstream toward a roughing line; and
restricting flow of the first gas upstream of the evacuation valve to thereby control pressure of the first gas flowing into the roughing line.

* * * * *